US006806752B2

(12) United States Patent
Heyne

(10) Patent No.: US 6,806,752 B2
(45) Date of Patent: Oct. 19, 2004

(54) METHOD AND LOGIC/MEMORY MODULE FOR CORRECTING THE DUTY CYCLE OF AT LEAST ONE CONTROL/REFERENCE SIGNAL

(75) Inventor: Patrick Heyne, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/340,046

(22) Filed: Jan. 10, 2003

(65) Prior Publication Data

US 2003/0128061 A1 Jul. 10, 2003

(30) Foreign Application Priority Data

Jan. 10, 2002 (DE) ......................................... 102 00 620

(51) Int. Cl.[7] ................................................ G06F 1/04
(52) U.S. Cl. ....................................... 327/175; 327/172
(58) Field of Search ................................. 327/175, 172, 327/170

(56) References Cited

U.S. PATENT DOCUMENTS

| 5,477,180 A | 12/1995 | Chen ........................... 327/175 |
| 6,169,434 B1 | 1/2001 | Portmann .................... 327/175 |

*Primary Examiner*—Dinh T. Le
(74) *Attorney, Agent, or Firm*—Laurence A. Greenberg; Werner H. Stemer; Ralph E. Locher

(57) ABSTRACT

A method and logic/memory module set the desired corrected duty cycle between the time periods of the first and second level states of at least one control/reference signal. In that, the rising time period of the rising edge and/or the fall time period of the falling edge of the control/reference signal are increased and/or decreased (i.e. changed) by a predefinable correction time period.

36 Claims, 8 Drawing Sheets

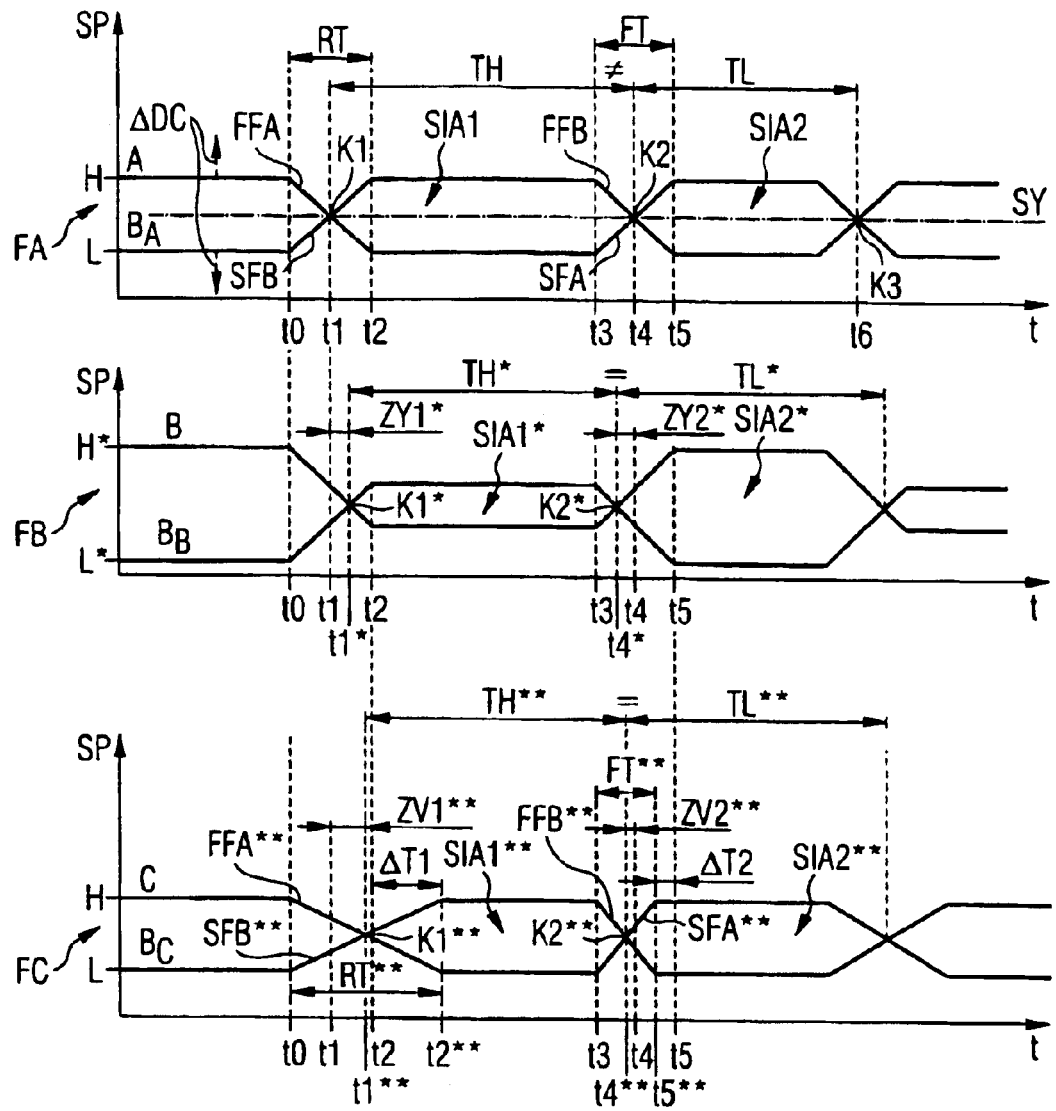

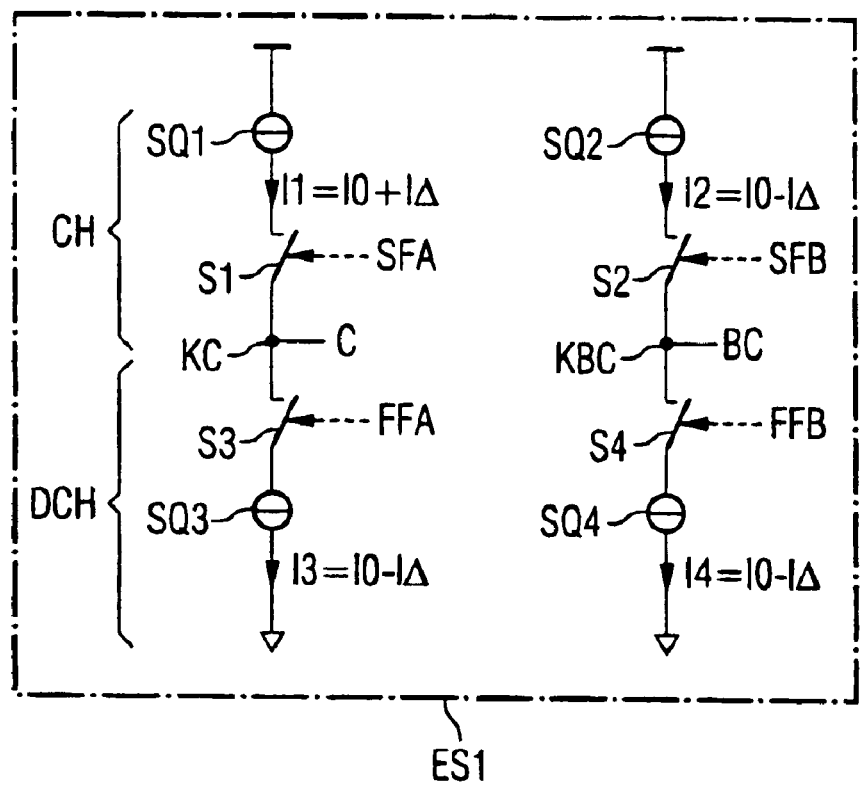
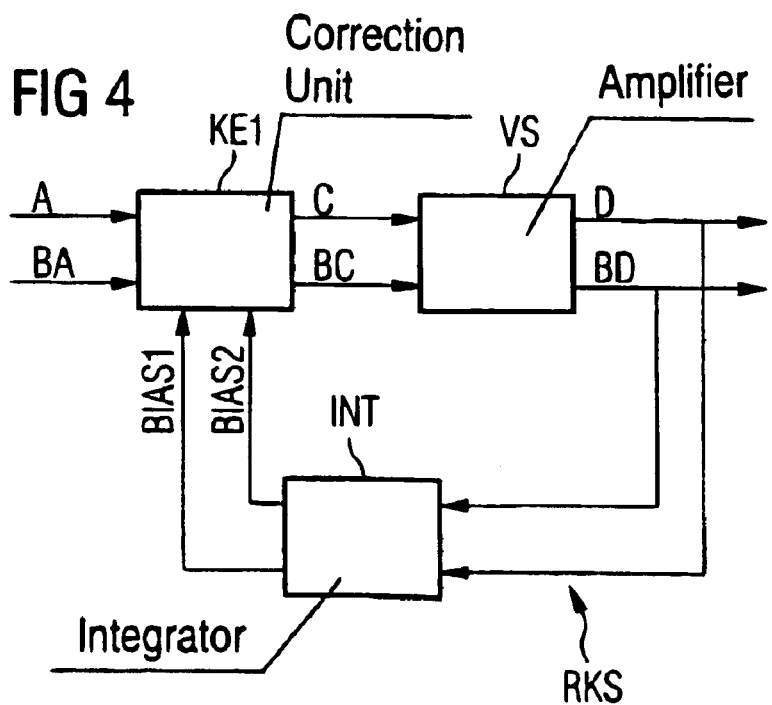

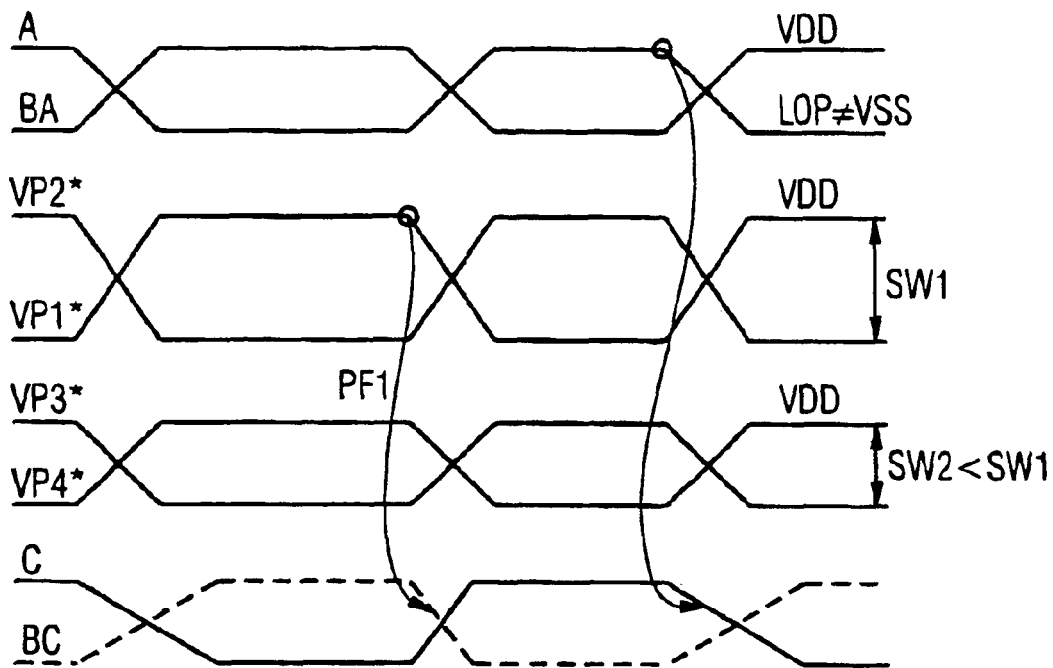
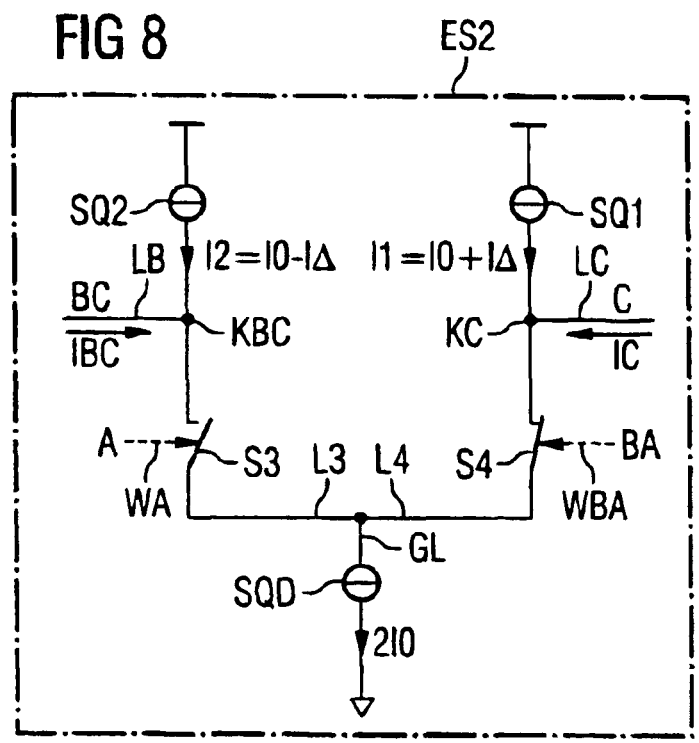

METHOD AND LOGIC/MEMORY MODULE FOR CORRECTING THE DUTY CYCLE OF AT LEAST ONE CONTROL/REFERENCE SIGNAL

BACKGROUND OF THE INVENTION

Field of the Invention

The invention relates to a method for correcting the given duty cycle between the first time period of a first level state and the second time period of a second level state of at least a first periodic control/reference signal of a logic/memory unit to form a desired duty cycle.

For example, in order to process, transmit, store, etc. data signals, in digital systems, for example microprocessors, logic/memory modules such as DRAMs (Dynamic Random Access Memory), SDRAMs (Synchronous Dynamic Random Access Memory), or SGRAMs (Synchronous Graphic Random Access Memory), flash memories, integrated circuits such as ASICs, or in particular such circuits using CMOS technology, clocking is performed, i.e. the timing of switching times is determined, using at least one additional control/reference signal. Here, switchover times are defined by the given duty cycle between the time periods of the first and second level state—for example the high and low levels—of such a periodic control/reference signal. Such a control/reference signal is usually referred to in microelectronics as a clock signal. In practice, the actual duty cycle between the time periods of the two level states of the period control/reference signal may then deviate from a desired setpoint duty cycle, in particular even fluctuate or vary chronologically with respect to it. However, as a result in particular clock-synchronous transmission, further processing and/or storage of data signals is made more difficult, as in the case of non-equidistant switching times partial superimposition of two successive data signals may occur. The chronological assignment of the individual data signals, which are each of preferably equal length, can thus become ambiguous at the switching times of the respective control/reference signal. In particular, as a result of such superimposition individual data bits are no longer reconstructed, no longer identified and are thus lost. When more stringent requirements are made of the processing speeds or data throughput rates, this problem becomes even more critical as, to solve it, a periodic control/reference signal with a relatively high frequency, i.e. shorter time intervals between its two different switching states, is used.

SUMMARY OF THE INVENTION it is accordingly an object of the invention to provide a method and a logic/memory module for correcting the duty cycle of at least one control/reference signal that overcomes the hereinafore-mentioned disadvantages of the heretofore-known methods and devices of this general type and that corrects a desired setpoint duty cycle for at least one control/reference signal with at least two level states for the ratio of its time periods.

With the foregoing and other objects in view, there is provided, in accordance with the invention, a method in which the desired corrected duty cycle between the time periods of the first and second level states of the first control/reference signal is set in that the rising time period of its rising edge and/or the fall time period of its falling edge is increased and/or decreased by a predefinable correction time period.

A desired duty cycle between the time periods of the first and second level states of this clock/reference signal can easily and reliably be set in a controlled fashion by virtue of the fact that the rising time period of the rising edge and/or the fall time period of the falling edge of the respective control/reference signal is increased and/or decreased; thus, the rising edge and/or the falling edge of this control/reference signal is slowed down and/or sped up. The original level values for the first and second level states of the respective control/reference signal can thus be largely maintained as, of course, correction of the given duty cycle to form a desired setpoint duty cycle between the two level states of the respective control/reference signal is made possible only by using an active control of the edge rising time and/or edge fall time.

According to one expedient development of the invention, the duty cycle of the respective clock/reference signal is set in a correcting fashion such that the time period of its first level state corresponds essentially to the time period of its second level state. In other words, this means that expediently a 50:50 ratio is set between the time periods of the two level states of the respective control/reference signal. This 50 to 50 percentage duty cycle is referred to in microelectronics as a perfect duty cycle. This means in particular that during a clock cycle the digital high signal has as far as possible the same chronological length as the digital low signal. Such a 50% duty cycle is advantageous in particular for clock signals which use both the rising edge and the falling edge at each level change for triggering purposes, i.e. for clocking data signals such as, for example, for transmitting, further processing and/or storing them. In this way, high-performance synchronous data transmissions can advantageously be carried out in a reliable way using two data bits per clock cycle, for example in a system with double data rate memory modules.

The invention also relates to a logic/memory module, in particular a double data rate memory module, which has at least one logic unit for carrying out the method according to the invention.

Other features that are considered as characteristic for the invention are set forth in the appended claims.

Although the invention is illustrated and described herein as embodied in a method and a logic/memory module for correcting the duty cycle of at least one control/reference signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 including three graphs plotting signals versus a shared time axis, the graphs illustrate how two control/reference signals that are assigned to one another and clocked in antiphase are corrected in terms of the duty cycle between the time periods of their two level states in accordance with the inventive principle and a specific desired setpoint duty cycle can be set, the differences from the prior-art correction method according to U.S. Pat. No. 6,169,434 being indicated;

FIG. 2 is a schematic view showing a first electrical equivalent circuit for a correction unit with which a first variant of the method according to the invention for correcting the given duty cycle of two control/reference signals which are assigned to one another and clocked in antiphase in accordance with FIG. 1 can be carried out;

FIG. 6 is divided into FIGS. 6A and 6B;

FIG. 4 is a block diagram showing the principle of a control loop for the correction unit according to FIGS. 2, 3, 5, and 6 for the controlled setting of a desired setpoint duty cycle for two differential control/reference signals clocked in antiphase as input signals;

FIG. 7 is a timing profile on the drive lines, output lines, and two intermediately connected internal lines of the correction unit according to FIG. 5;

FIG. 8 is a circuit diagram showing a second equivalent circuit for a correction unit with which a second variant of the principle according to the invention for correcting the given duty cycle of the two control/reference signals according to FIG. 1 can be carried out.

DESCRIPTION OF THE PREFERRED EMBODIMENTS

Figure 3:
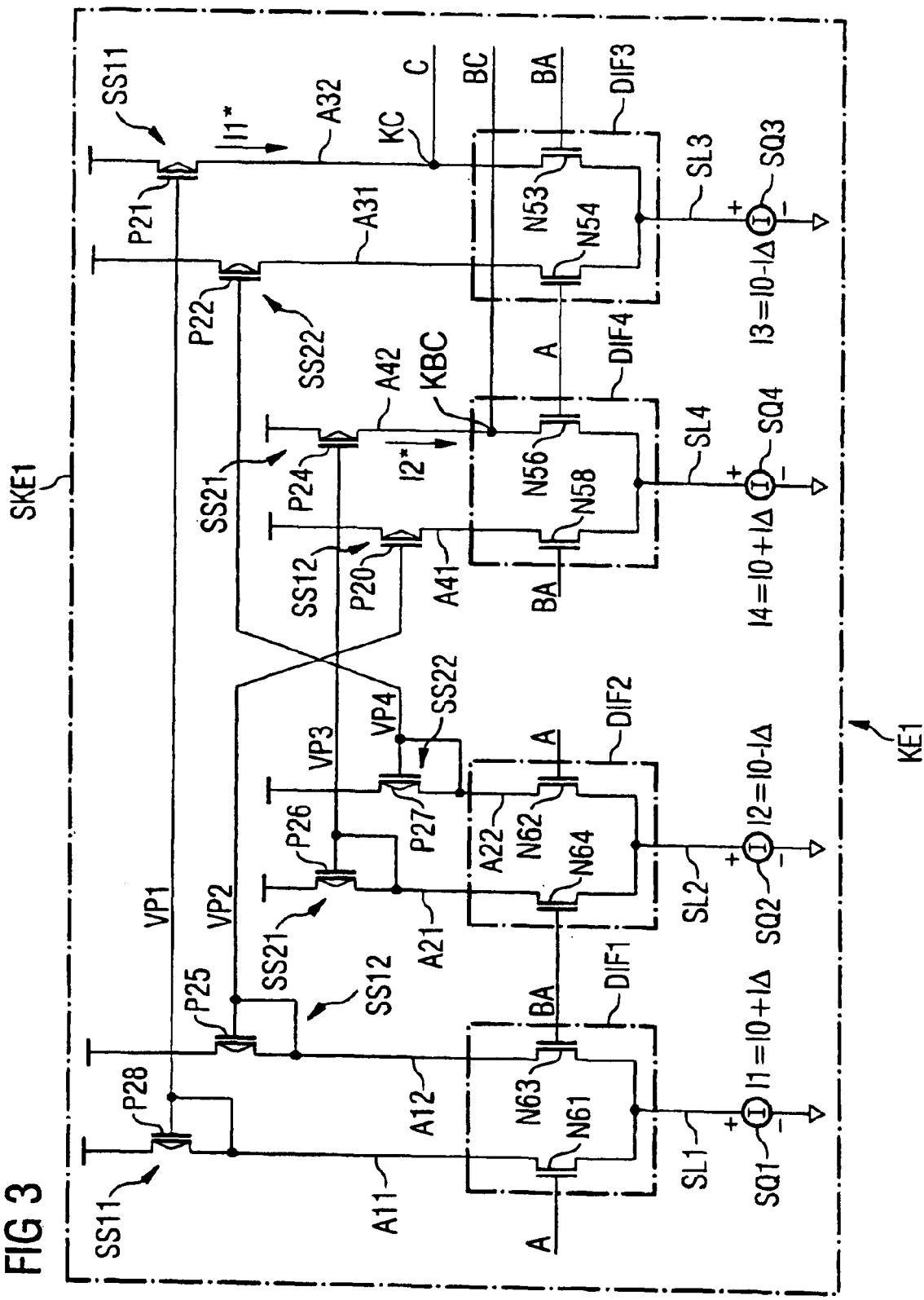
FIGS. 3, 5, and 6 are circuit diagrams respectively showing three different logic circuits, each for implementing the correction unit according to FIG. 2, for convenience

In all the figures of the drawing, sub-features and integral parts that correspond to one another bear the same reference symbol in each case.

Referring now to the figures of the drawings in detail and first, particularly to FIG. 1 thereof, there is shown a schematic view of three level/time diagrams FA, FB, FC. Each of the level/time diagrams has two control/reference signals that are assigned to one another. Here, potential level values SP of the respective control/reference signal are plotted along the ordinate of the respective level/time diagrams FA, FB, FC, and associated time values t are plotted along the abscissa. The first level/time diagram FA in the upper half of FIG. 1 represents the potential level time profiles of two periodic control/reference signals, in particular clock signals, BA, A along an exemplary time segment. The clock signals BA, A are assigned to one another. The first periodic control/reference signal BA has two potential level states H, L each with a constant potential that it assumes alternately for a specific time period in each case. Here, the potential level of the control/reference signal BA rises in a ramp-like manner, preferably essentially in the form of a straight line, i.e. largely linearly, in each case in the transition zone from its relatively low level state L to its relatively high level state H. The control/reference signal BA therefore has a rising edge in each case in the chronological transition zone (rise time) when there is a changeover from its relatively low potential level L to its relatively high potential level H. In FIG. 1, the control/reference signal BA changes from its relatively low potential level L to its relatively high potential level H, in the time period between the times t0 and t2, for example. Its rising edge is referred to there by SFB, and the time period required for it (=rise time) by RT. Correspondingly, at the changeover from its relatively high constant potential level H to its relatively low constant potential level L, the control/reference signal BA occurs in a chronological transition zone (fall time) with an essentially linearly extending edge. Such a falling edge of the control/reference signal BA is referred to by way of example by FFB in the time period FT (fall time) between the times t3 and t5 at the changeover from the relatively high potential level H to the relatively low potential level L. The control/reference signal BA is generated cyclically here over the time t in this way with the two states of a relatively high potential level H and a potential level L which is relatively low with respect to it and a rising edge such as SFB at the changeover from the relatively low to the relatively high signal level, and a falling edge such as FFB at the changeover from the relatively high signal level to the relatively low signal level. In this way, the periodic control/reference signal BA assumes a first level state during a first time period, calculated from approximately the center of its respective rising edge over the time segment (like t3 –t2 here) of its constant potential level H to approximately the center of its falling edge. In FIG. 1, this first time period for the first level state between the time t1 at the center of the rising edge SFB and the time t4 at the center of the falling edge FFB is referred to by TH. In an analogous fashion, the control/reference signal BA is assigned a second time period for its second level state starting approximately from the center of its falling edge to approximately the center of its next rising edge. In the level/time diagram FA in FIG. 1, this time period starting from the time t4 at approximately the center of the falling edge FFB of the control/reference signal BA as far as the time t6 at approximately the center of the next rising edge of the control/reference signal BA is designated by TL. Considered overall, the respective periodic or cyclical control signal is thus composed of two trapezoidal signal level elements per period.

For the present exemplary first control/reference signal BA, the first time period TH of the first level state H is different from the second time period TL of the second level state L, i.e. the given actual duty cycle TH/TL between the first time period TH of the first level state H and the second time period TL of the second level state L is not 50:50 but rather unequal to 1, i.e. different from 1. This is because the first time period TH for the first level state is longer than the second time period TL for the second level state L. Such an unequal distribution of the time periods TH, TL for the two level states of the respective control/reference signal such as BA can be caused in practice, in particular in the case of electronic circuits, preferably integrated circuits, logic/memory modules and chips, microprocessors, and other digital system units, by nonideal signal generators, parasitic interference/crosstalk from the signal line of the respective control/reference signal to other adjacent data lines (and vice versa), capacitive coupling and internal and/or external load circuitry with electronic components, varying technological parameters such as those of integrated circuits owing to deviations in the manufacturing process, and by a multiplicity of further interference variables. Here, in addition, the distribution of the two level states H, L considered over the time t may, if appropriate, change, i.e. the duty cycle TH/TL is not constant over time but rather may also vary over time.

As a result of the periodic change between the two level states, switching times may be used, with the aid of the respective control/reference signal, preferably to control, check and/or monitor data signals in electronic systems, for example integrated circuits, logic/memory modules, microprocessors, digital bus systems etc. In particular, switching times may be defined by the centers of the rising edges of the respective control/reference signals. In addition, or irrespective thereof, it may, if appropriate, also be expedient for the centers of the falling edges of the same control/reference signal to define further additional switching times. The transmission, further processing and/or storage (in particular writing/reading operations in logic/ memory units), monitoring and/or other methods of processing data signals can then be triggered at this multiplicity of switching times.

For a data processing method that is as efficient and largely free of faults as possible, it is desirable here for the switching times to comply as precisely as possible with a predefined setpoint timing pattern, which requires a specific setpoint duty cycle TH/TL between the two time periods of the first and second level states H, L of the respective control/reference signal, for example BA. For this reason, if there are any deviations in the given actual duty cycle, for example TH/TL from the setpoint duty cycle, a correction of the time periods of the first and second level states of the respective periodic control/reference signals to form the respectively desired setpoint duty cycle is advantageously aimed at. This is expedient in particular if triggering, in particular activation or deactivation and/or monitoring of data signals is performed in each case both with the rising edge such as SFB and with the falling edge such as FFB of the respective cyclical control/reference signal. This is because, in comparison with the situation in which in each case only the rising edge of the high/low square-wave bit pattern of the respective control/reference signal is used to define a starting time such as for the transmission of data or passing on of data, data processing and/or storage (single data rate) double the working speed is advantageously achieved in that now, in addition to the rising edges, the falling edges of the square-wave pulses of the respective cyclical control/reference signal are also used to define starting times or checking times for the data processing. This mode is known as a double data rate processing mode in memory or chip technology.

In particular, it is expedient here to set the duty cycle TH/TL of the time periods of the two level states of the respective control/reference signal in a correcting fashion such that the time period of the first level state H corresponds essentially to the time period of the second level state L of the corrected control/reference signal. As a result, specifically superimpositions of successive data signals are largely avoided so that an unambiguous assignment of the centers of the rising and falling edges to in each case a specific data signal, and an unambiguous identification or detection of each individual data signal is made possible. Furthermore, in the case of circuits that operate in the double data rate mode (that is to say use the respectively rising and the respectively falling edge as trigger times), the same equally long time period is always available from one trigger time to the next. This is advantageous at high frequencies at which the delays of circuit groups approach half a clock period.

In order to be able to make switching times that can be defined by the centers of the rising and/or falling edges as insensitive as possible to interference on the potential level of the respective control/reference signal, in practice a second periodic control/reference signal is advantageously used. The second periodic control/reference signal has essentially the same level states as the first control/reference signal but is switched with its timing offset by a half period (in the case of a desired 50% duty cycle). In the first level/time diagram FA in FIG. 1, such a second control/reference signal A is also shown in addition to the first control/reference signal BA. It assumes its two level states H, L in antiphase with respect to the first control/reference signal BA, i.e. the two signals BA, A are switched in a complementary fashion with respect to one another, even when the duty cycle is not perfect. In particular, it means that the second control/reference signal assumes the relatively low potential level L during that time period, here for example between the times t2 and t3, during which the first control/reference signal BA has its relatively high potential level H. Conversely, the second control/reference signal A is assigned the relatively high potential level H during that time period in which the first control/reference signal has its relatively low potential level L. In this way, in each case a rising edge, for example SB of the first control/reference signal BA is assigned, in each case during its rise time RT, a falling edge such as FFA of the second control/reference signal A. Correspondingly, the control/reference signal A has a rising edge SFA during the respective fall time FT of the first control/reference signal BA, i.e. if its falling edge such as FFB occurs. As a result of this pair of two control/reference signals BA, A, intersection points or crossover points such as K1, K2 of their rising and falling edges, for example SFB/FA, FFB/SFA are thus defined as switching times such as t1, t4 with which in particular, for example, the transmission, storage and/or processing of data signals can be controlled. In this way, in each case what is referred to as a signal eye is formed between, in each case, two such crossover points of the two control/reference signals, by the two control signals that are complementary to one another. Here, in the exemplary embodiment of the diagram FA of FIG. 1, two essentially trapezoidal signal eyes, for example SIA1, SIA2 between the points of intersection, for example K1, K2 as well as K2 and K3 follow one another chronologically per clock period. Here, the signal eye SIA1 has a greater chronological length TH than the time period TL of the following signal eye SIA2.

By subtracting the two control/reference signals A, BA the switching times, for example K1, K2 can preferably be made largely insensitive to interference on their absolute level profiles in a large advantageous way as they can be largely averaged out by the subtraction. Such an absolute offset in the vicinity of the rising and/or falling edge of an individual control/reference signal which is caused by interference would in fact possibly lead to an incorrect definition of the respective switching time in the center of the respectively rising and/or falling edge. This is largely avoided by making available two differential periodic clock signals such as BA, A and forming a difference between them during their evaluation.

If the given duty cycle such as TH/TL between the time periods TH, TL of the two level states of the first and/or second periodic control/reference signal, such as BA, A then differs from a desired setpoint duty cycle, according to the inventive principle, the given actual duty cycle TH/TL can be corrected. In that, the rise time period, for example RT, of the respectively rising edge such as SFB and/or the fall time period such as FT of the respectively falling edge such as FFB of the respective control/reference signal such as BA, A is increased and/or decreased in each case by a predefinable correction time period. In the present exemplary embodiment, the time period TH is longer than the time period TL of the two actual control/reference signals BA, A, i.e. the points of intersection or nodes such as K1, K2, K3 follow one another at nonequidistant and thus different time intervals. However, when the two control/reference signals BA, A are used as clock signals for synchronous clocking of data signals it is preferably desired for the points of intersection or nodes of the two control/reference signals to follow one another at equidistant intervals. In this respect, in order to correct the actual duty cycle TH/TL of unequal to one (TH is unequal to TL) into a desired 50:50 setpoint duty cycle (TH=TL), in particular in the present exemplary embodiment the rising edges of the first control/reference signal BA are slowed down, i.e. made flatter and its falling edges are speeded up, i.e. made steeper. In contrast to this, if there is a second control/reference signal A which is switched in an inverted or complementary fashion with respect to the latter the falling edges are at the same time slowed down, i.e. made flatter and the rising edges speeded up, i.e. made steeper.

The third level/time diagram FC of FIG. 1 shows a schematic view of the level profiles of the two control/reference signals according to such a first variant of the correction according to the invention. There, the corrected first control/reference signal that is attained from the original, first control/reference signal $B_A$ of the diagram FA, is referred to by $B_C$. The corrected second control/reference signal, which is generated from the original second control/reference signal A of the diagram FA, is provided with the reference symbol C in the diagram FC in FIG. 1.

In particular, in the exemplary embodiment here, the edge rise time period (rise time) RT of the respectively rising edge, for example SFB of the first control/reference signal BA, is lengthened by an additional correction time period, for example $\Delta t1$ (compare diagram FC in FIG. 1). This means that, for example, the rising edge SFB of the corrected first control/reference signal BC rises starting from its low level L at the time t0 in a linear fashion until it reaches its high level H at the time t2. Here, the time t2 lies chronologically later than the time t2 at which the high level H has been reached by the rising edge SFB of the original control/reference signal BA. The corrected rising edge of the corrected first control/reference signal BC is referred to by SFB in the diagram FC. This rising edge SFB has a smaller positive gradient than the originally given rising edge SFB of the uncorrected first control/reference signal BA. In an analogous fashion, the falling edge FFA (compare diagram FA) of the second control/reference signal A, which is complementary to the first control signal BA, is flattened out. The corrected falling edge FFA of the second corrected control signal C starts to fall linearly at the time t0 starting from the high level H up to the time t2 until it reaches the predefined low level L there. The falling edge FFA of the corrected second control/reference signal C thus has, in absolute terms, essentially the same positive gradient as the rising edge SFB of the corrected first control signal BC, but with opposite signs. In the diagram FC in FIG. 1, the lengthened edge rise time period of the rising edge SFB and the edge fall time period of the falling edge FFA that is lengthened in precisely this way are designated by RT.

In this way, by prolonging the edge rise time of the respective rising edge of the first control/reference signal and the edge fall time period of the falling edge of the second control/reference signal, which respectively corresponds to the latter, a displacement of the original point K1 of intersection is brought about by, in each case, a predefinable time factor such as here, for example, $\Delta t1$ in the direction of that signal eye, such as SIA2 in this case, which is formed between the two control signals BA, A and is assigned to the shorter time period TL. In the diagram FC in FIG. 1, for example the point K1 of intersection of the two corrected control signals BC, C is displaced chronologically to the right toward the shorter signal eye SIA2 (compare diagram FA) by the time period ZV1 with respect to the original chronological position t1 of the node K1 of the uncorrected, original control signals BA, A. As a result, the original, first signal eye SIA1 of the time period TH, which is formed between the two original control signals BA, A is shorted chronologically by the time period ZV1. The signal eye SIA1, which is shortened owing to the chronological prolonging of its rising edge SFB and falling edge FFA, is designated by SIA1 in the diagram FC in FIG. 1.

Expressed in general terms, the edge rise time or edge fall time is therefore advantageously prolonged by a predefinable correction time period, in each case at the start of that signal eye of two control signals which are in antiphase with respect to one another and complementary to one another. The signal eye has a chronologically longer chronological length such as TH, for example, than the time period such as TL, for example, of the next following signal eye. As a result, the longer signal eye can be shortened in a defined way. In this context, the original absolute potential levels such as L, H, for example, for the corrected control signals such as BC, C, for example, can be advantageously retained.

A further possible way of shortening the originally longer signal eye such as SIA1, for example, is in particular to shorten the edge fall time or edge rise time at the end of the signal eye by a predefinable correction time period. In accordance with the diagram FC in FIG. 1, the first signal eye SIA1 has, at its end for the corrected first control signal BC, a falling edge FFB which falls linearly from the high level H starting from the time t3 to the low level L up to the time t5. The time t5 is displaced here by $\Delta T2$ earlier than the time t5 at which the uncorrected, originally falling edge FFB reaches the low level L (cf. diagram FA in FIG. 1). In this way, the fall time period FT of the falling edge FFB is shorted with respect to the original fall time FT by the correction time period $\Delta T2$. In a corresponding way, the rising edge SFA of the second, original control signal A is shortened by the same correction time period $\Delta T2$. This rising edge, which is shorted for the sake of correction, is designated by SFA in the diagram FC in FIG. 1. Between the corrected falling edge FFB and the corrected rising edge SFA there is a resulting point KS of intersection at the time t4 which is displaced by the time period ZV2 in the direction of the first point K1 of intersection with respect to the chronological position t4 of the original point K2 of intersection. In this way, the second original data eye SIA2 that follows the first data eye SIA1 is simultaneously prolonged at its chronologically earlier end, i.e. on the left here, by the correction time period ZV2. At the same time, it is correspondingly prolonged at its chronologically later end on the right by the correction time period ZV1, as it is, of course, followed in turn by a relatively long signal eye, in a way analogous with SIA1, (which is however emitted from FIG. 1 for the sake of clarity) owing to the periodicity of the signals.

In general terms, the edge rise time or edge fall time is therefore advantageously shortened by a predefinable correction time period, in each case at the start of that signal eye of the two control or clock signals which are in antiphase with respect to one another and complementary to one another, the signal eye being chronologically shorter than the chronologically preceding signal eye. As a result, this shorter signal eye can be prolonged in a defined way. In this context, the original absolute potential levels can advantageously be retained, for example, L, H for the corrected control signals such as BC, C, for example.

The chronological correction factor, for example $\Delta T1$ for prolonging the edge rise time or edge fall time at the start of that signal eye, for example SIA1 whose chronological length, for example TH, is longer than the chronological length, for example TL, of the following signal eye SIA2, is expediently set as follows in order to obtain a 50% duty cycle:

$$TH-(ZV1+ZV2)=(TH-TL)/2$$

$\Delta T1 = 2\ ZV1$

The chronological shortening factor, for example ΔT2 at the end of each signal eye, for example SIA1 whose time period, for example TH, is originally longer than the time period TL of the following, next signal eye, for example SIA2, can preferably be selected in the following way in order to set a desired duty cycle in a defined fashion:

$\Delta T2 = 2\ ZV2$

This makes it possible, in particular by adapting the time period for the rising and/or falling edge of each control signal, to set a specific, desired duty cycle between its two different level states (high level H, low level L) in a controlled way. The prolonging of the rising and falling edges at the start of that signal eye that has a longer chronological length than the next, subsequent signal eye can, in an extreme case, even be made as long as the chronological length, for example TH, of this originally longer signal eye, for example SIA1. This would then correspond to a maximum chronological displacement of the respective point of intersection such as K1, for example. Correspondingly, at the end of this longer data eye such as SIA1, for example, it is possible to achieve maximum shortening in that the falling or rising edge changes virtually at a 90° angle between the two potential levels. In this regard, it is therefore possible to set the length of the signal eye in relation to the directly following, next signal eye in a wide variation range in a controlled manner merely by using active, i.e. targeted setting of the edge steepness at the start and/or at the end of the respective signal eye. In the present exemplary embodiment, the chronological length of the two signal eyes SIA1, SIA2 (cf. diagram FA in FIG. 1) which follow one another per period was expediently corrected in such a way that their chronological lengths TH, TL essentially correspond after the correction in accordance with the invention. These ratios are represented in the diagram FC in FIG. 1, where the two successive corrected signal eyes SIA1, SIA2 each have essentially the same chronological lengths TH=TL. Of course, it is, if desired, also possible to set a different desired duty cycle in this way.

In particular, in this way it is possible to convert a given 60% actual duty cycle into a 50+/−1% setpoint duty cycle, and to convert a 70% actual duty cycle into a 50+/−3% set point duty cycle.

In a DRAM, SDRAM, or SGRAM logic/memory chip using CMOS technology, preferably a potential value of approximately 1.2 V is selected for the low potential level L. Preferably, a potential value of approximately 2 V is assigned to the high potential level H. This results in a level excursion of approximately 0.8 V between the two level states H, L.

The correction method according to the invention is defined in particular by the fact that the given edge steepness of the original control signals BA, A leaves the correctable region of the duty cycle between the two level states of the two control signals BA, A largely uninfluenced, or does not determine them at all. This is because, in the correction method according to the invention, the duty cycle is set in a defined way particularly by using a controlled setting of the edge steepness. If two control signals, which are assigned to one another in a complementary fashion, for example BA, A, are used here, the duty cycle is preferably determined by the chronological lengths, for example TH, TL, of in each case of two chronologically successive signal eyes such as SIA1, SIA2, for example.

If, on the other hand, an attempt were made to set the chronological length of each clock signal eye to a specific, desired chronological length by additionally adding a potential DC component to one or both control signals such as BA, A, for example, the given edge steepness of the two original control signals such as BA, A, for example, would, on the other hand, actually determine the correctable region of the duty cycle. This is illustrated schematically by the level/time diagram FB in FIG. 1. There, the corrected level profile for the first, original control signal BA is designated by BB, and the corrected level profile for the second, original control signal A is designated by B. The time periods such as TH*, TL*, for example, of in each case two successive signal eyes such as SIA1*, SIA2*, for example, are made essentially of equal length in the case of these two corrected control signals by virtue of the fact that the original first control signal BA is decreased by a constant potential component ΔDC (cf. diagram FA), and the second original control signal A is increased by the same constant component ΔDC. As a result, for example of the point K1 of intersection of the two original control signals BA, A migrates, at the start of their signal eye SIA1, in the direction of the subsequent, shorter signal eye SIA2. The chronological shifting, which is achieved by changing the absolute level values of the two original control signals BA, A for the first point K1 of intersection in this way, is designated by ZV1* in the diagram FB. The resulting new point of intersection between the two control signals BB, B whose potential levels are changed is provided with the reference symbol K1* in the diagram FB. The point of intersection is assigned the time t1* which is delayed by the chronological period ZV1* with respect to the time t1 of the original point K1 of intersection. In a corresponding way, the absolute levels of the two control signals BA, A are separated by, in each case, the constant correction potential level ΔDC at the end of the first data eye SIA1 that the point K2 of intersection there at the time t4 moves forward by the time period ZV2* to the time t4*. The new point of intersection at the new time t4* is designated by K2* in the diagram FB. By correspondingly adding or subtracting a constant potential level to or from each signal level, it is thus also possible to transform the original signal eyes to the effect that their chronological lengths such as TH*, TL*, for example, are of essentially the same magnitude. This correction method is described in detail, for example, in U.S. Pat. No. 6,169,434. The chronological correction region within which the chronological length of the respective signal eye can be varied (or within which the time interval of every two successive points of intersection of the two control signals can be changed) is, however, limited in this known method in that a point of intersection between the two control signals must also be possible as a result of the adding or subtracting of a constant potential component. This is because the points of intersection between the two control signals determine, of course, the switching times, in particular for processing, transmitting and/or storing data signals. With this method, the duty cycle can therefore be corrected only to a restricted degree, and in practice it is too restricted for a large number of conditions. Furthermore, the generation of the corrected signals BB, B is conditional here on the given original control signals A, BA having relatively slow rising edges and falling edges. This is because their edge steepness directly influences the possibly correctable time range of the duty cycle by virtue of the fact that a point of intersection of the respective rising edge of the one clock signal must still be possible with the correspondingly assigned falling edge of the complementary second clock signal. For this reason, this would additionally require signal conditioning stages for extra connection upstream in order to preprocess the edges, which would be too costly.

FIG. 2 shows a first electrical equivalent circuit or correction unit ES1 with which the two original complementary control signals BA, A can be transformed in accordance with the diagram FA in FIG. 1 to form the corrected control signals BC, C of the diagram FC in FIG. 1 with the desired duty cycle TH=TL, i.e. signal eyes of essentially equal length. The correction unit ES1 has four power sources SQ1 through SQ4. These are configured in two groups that are each used to generate one of the two corrected control signals BC, C. The first group is formed by the two power sources SQ1, SQ3. These are used for charging and discharging a first capacitive output node KC for tapping the corrected control signal C. Correspondingly, the two power sources SQ2, SQ4 form a second group for charging and discharging a second capacitive output node KBC at which the corrected control signal BC can be tapped. The power source SQ1 is connected to and/or disconnected from the capacitive output node KC using a switch S1, and the power source SQ3 is connected to and/or disconnected from the capacitive output node KC using a switch S3. Correspondingly, the power source SQ2 is connected to and/or disconnected from the capacitive output node KBC using a switch S2 and the power source SQ4 is connected to and/or disconnected from the capacitive output node KBC using a switch S4.

In order then to transform the two control signals BA, A in the diagram FA in FIG. 1 with the given duty cycle TH/TL≠1 into the two corrected control signals BC, C of the diagram FC in FIG. 1 with the desired 50:50 duty cycle (TH=TL), the four power sources SQ1 with SQ4 of the correction unit ES1 are preferably switched dynamically in the following chronological sequence and with the following time periods of the charging and/or discharging process using the uncorrected control/reference signals BA, A:

When the rising edge SFB of the first control signal BA occurs, the switch S2 is closed for the time period RT, which is indicated in FIG. 2 by an action arrow. As a result, the power source SQ2 charges the capacitive output node KBC for the time period RT using a current I2 whose base current component I0 is reduced by a current correction factor IΔ. Therefore I2=I0−IΔ. As a result, the edge SFB of the corrected control signal BC rises more slowly than the edge SFB of the original control signal BA. The base current component I0 is here that electrical current that would bring about the level profile with the rising edge SFB in accordance with diagram FA in FIG. 1 when the capacitive output node KBC is charged for the time period RT. During this rise time of the rising edge SFB of the first control signal BA, the start of the falling edge FFA of the second control signal A is at the same time used to close the switch S3 for the same time period RT so that the electric current I3 whose base current component I0 is also reduced by the current correction factor IΔ is subtracted from the capacitive output node KC using the power source SQ3. As a result, the falling edge SFB of the second control signal A is flattened with the same gradient as the rising edge of the first control signal BA. There is thus a resulting increase in the edge fall time and thus a slowed falling edge FFA** corresponding to the diagram FC in FIG. 1. The base current component I0 here is that electric current which, if the capacitive output node KC is discharged for the time period RT, would bring about the originally given actual level profile with the falling edge FFA in accordance with diagram FA in FIG. 1.

In summary, in the exemplary embodiment here the rising edge SFB of the first control signal BA is used to charge the capacitive output node KBC at the start of the relatively long signal eye SIA1 with a basic current I0 which is reduced by the current correction factor. IΔ and which would generate the rising edge SFB with its original steepness corresponding to the diagram FA in FIG. 1. By deducting the current correction factor IΔ from this base current I0 it is possible, in a selective fashion, to bring about a delay in the charging of the capacitive output node BC starting from the low level L of the first control signal BA to its high level H. This delay is designated by ΔT1 in the diagram FC in FIG. 1. The prolonged rise time for the rising edge SFB is designated by RT in the diagram FC in FIG. 1. For the rise time, RT=RT+ΔT1. Analogously, the falling edge FFA of the second control signal A which falls in the same time period RT is thus flattened with the same gradient as the rising edge SFB by virtue of the fact that the capacitive output node KC is discharged with the base current I0 which is reduced by the current correction factor IΔ and which would otherwise, without a current correction factor, bring about the falling edge FFA with the original gradient corresponding to the diagram FA in FIG. 1. The capacitive output node KC which is charged with the potential level H is thus discharged to the low level L delayed by the time period RT=RT+ΔT1. Chronological shortening of the longer signal eye in the vicinity of its chronological start can thus be set in a controllable fashion.

In order to allow the longer signal eye such as SIA1, for example, also to shrink at its chronological end, the capacitive output node KBC is subsequently discharged with the base current I0 which is enlarged by the current correction factor IΔ, at the start of the falling edge FFB to a greater extent than during mere discharging with the base current I0, which would otherwise merely generate the conditions in the diagram FA in FIG. 1. In other words, the falling edge FFB of the first control signal BA is now made steeper owing to the increasing of the discharge current by the current correction factor IΔ in comparison with the original discharge current I0. The edge FFB is designated by FFB in the diagram FC in FIG. 1. By applying the additional current correction factor IΔ to the original discharge current I0, the original fall time FT of the falling edge FFB is shortened by the time period ΔT2. At the same time, during this time period FT, the desired steeper rise in the rising edge SFA of the second control signal A is forcibly brought about in that the capacitive output node KC for the second corrected control signal C is now amplified by the current correction factor IΔ, in addition to the basic current I0 with which the original rising edge SFA from the low level L to the high level H was brought about, the output node KC being thus charged more quickly. As a result, the rise time of the rising edge SFA can be shortened from the time period FT to the time period FT**=FT−ΔT2.

The switches S2, S3 are therefore closed simultaneously at the start of the rising edge such as SFB, for example, or the falling edge FFA at the chronological start of the respectively longer signal eye such as SIA1, for example.

This is carried out here, for example, for the first signal eye SIA1 at the time t0. The two power sources SQ1, SQ4 with associated switches S1, S4 are driven chronologically later at the start of the final falling or rising edge of the respective, originally longer signal eye such as SIA1, for example, in crisscross fashion with respect to the pair of power sources SQ2, SQ3 with associated switches S2, S3 that bring about an input-end shortening of the longer signal eye SIA1 by slowing down the original edges such as SFB, FFA, for example. This is initiated here, for example for the first signal eye SIA1 at the time t3.

In summary, the two power sources SQ2, SQ1 are thus used for the corrective charging of the capacitive output nodes KBC, KC. This is indicated in FIG. 2 using the reference symbol CH. In contrast, the power sources SQ3, SQ4 are used for the corrective discharging of these two capacitive-output nodes KC, KBC, which is indicated by the reference symbol DCH.

The basic current I0 is expediently selected in such a way that the charging and/or discharging of the respective capacitive output nodes KBC or KC would generate the signal pattern of the two control signals BA, A of the diagram FA with the edge steepnesses there at the output and at the end of the respective signal eye. Only by impressing a corresponding correction current factor IΔ with a positive and negative sign for a specific time period such as RT or FT, for example, on this base current is it possible to control the edge steepness in a desired way at the start and at the end of each data eye and set it in a controlled way.

The current correction factor IΔ is expediently derived from the difference between the levels of the two corrected control/reference signals such as BA, A, for example, which are integrated over one or more periods. In particular, a control loop corresponding to FIG. 4 is used for this. In the loop, the corrected output control signals BC, C at the capacitive output points of the correction unit KE1 are standardized by a downstream amplifier VS in terms of their edge steepness so that amplified, corrected control signals BD, D are formed. These drive an integrator INT in a feedback loop RKS. Expressed in rough terms, this integrator may be formed in particular by a chargeable and dischargeable capacitor. This integrator INT generates two control voltages BIAS1, BIAS2 which change the edge steepness of the correction unit KE1 until a desired duty cycle, in particular 50:50 duty cycle is set at the outputs of the amplifier VS.

The starting value for the current correction factor IΔ can be acquired here in particular from the difference between the levels of the two control/reference signals BA, A which are initially uncorrected, the levels being integrated over one or more periods.

FIG. 3 shows a schematic view of a first logic circuit KE1 that influences the chronological sequence and duration of the charging and/or discharging processes of the two capacitive output nodes KBC, KC by the power sources SQ1 to SQ4 of the functional correction unit ES1 in FIG. 2. The logic circuit KE1 has four transistor subtractor stages DIF1 to DIF4 that are connected to one another. Each subtractor stage DIF1 to DIF4 is respectively formed by two possibly identical transistors, in particular n-type transistors (N-channel field-effect transistor) that are each connected to one another by their source lines SL1 to SL4, i.e. are each connected to a common potential. In particular, the subtractor stage DIF1 has the two n-type transistors N61, N63, the subtractor stage DIF2 has the two transistors N64, N62, the subtractor stage DIF3 has the n-type transistor pair N54, N53 and the subtractor stage DIF4 has the n-type transistor pair N58, N56. In order to simulate the equivalent circuit ES1 in FIG. 2, the two subtractor stages DIF1, DIF2 are used to charge the capacitive output nodes KBC and KC. In contrast, the subtractor stages DIF3, DIF4 are used to discharge the capacitive output nodes KBC, KC. The first power source SQ1, which draws in total the current I1=I0+IΔ from the subtractor stage DIF1 is connected to the common source line SL1 of the first subtractor stage DIF1. The first control signal BA is connected to the gate input of the first transistor N63, while the second control signal A is applied to the gate line of the second transistor N61. The drain line A12 of the first transistor N63 is connected to the drain line A41 of the first transistor N58 of the fourth subtractor stage DIF4 via a current mirror circuit SS12 that is formed by p-type channel transistors P25, P20. The first control signal BA to be corrected is applied to this transistor N58 at its gate input. The drain line A11 of the second transistor N61 of the first subtractor stage DIF1 is connected to the capacitive output node KC via an electric current mirror circuit SS11 which is formed by p-type channel transistors P28, P21. This capacitive output node KC is provided as a tap in the drain line A32 of the first transistor N53 of the third subtractor stage DIF3. The first control signal BA to be corrected is applied to the transistor N53 here at its gate line. The power source SQ2 is connected to the common source line SL2 of the second subtractor stage DIF2 and draws the current I2=I0−IΔ from it. The first control signal BA to be corrected is applied to the gate line of the first transistor N64 of the second subtractor stage DIF2. In addition, the two gate lines of the transistors N63 of the first subtractor stage DIF2 and of the transistor N64 of the second subtractor stage DIF2 can be connected to one another as in FIG. 3. The gate line of the second transistor N62 of the second subtractor stage DIF2 is driven by the second control signal A to be corrected. The drain line A21 of the transistor N64 of the second subtractor stage DIF2 is in turn connected to the drain line A42 of the second transistor N56 of the fourth subtractor stage DIF4 via an electric current mirror circuit SS21 that is formed by two p-type channel transistors P26, P24 that are connected to one another. In the drain line A42, the capacitive output node KBC is provided for tapping the corrected control signal PC. The drain line A22 of the second transistor N62 of the second subtractor stage DIF2 is also connected to the drain line A31 of the second transistor N54 of the third subtractor stage DIF3 via a current mirror circuit SS22 which is formed in a known fashion by connecting two p-type channel transistors P27, P22. The power source SQ3, which impresses an electric current I3=I0−IΔ, is applied here to the common source line SL3 of the third subtractor stage DIF3 in order to discharge the capacitive output node KC. Correspondingly, the power source SQ4, which draws off an electric current I4=I0+IΔ from the subtractor stage DIF4, is applied to the common source line SL4 of the fourth subtractor stage DIF4 in order to discharge the capacitive output node KBC. Preferably, a current mirror with a known function and mode of operation such as is specified, for example, in the book "Halbleiterschaltungstechnik [semiconductor circuit technology]" by Tietze, Schenk, 7th edition 1985, in FIG. 5.13 of chapter 5.5, may preferably be used as the current mirror circuit SS11, SS12, SS21, SS22.

Considered generally, in each case one of the two drain lines of each charging subtractor stage DIF1, DIF2 is connected in crisscross fashion, i.e. alternately to in each case one drain line of the discharging subtractor stages DIF3, DIF4 via a current mirror circuit. In particular, one of the two drain lines of the charging subtractor stage to which the higher overall current I0+IΔ is applied is connected to that drain line of the discharging subtractor stage that is to discharge one of the two output nodes with the lower overall current I0−IΔ. In particular, one of the two drain lines of the charging subtractor stage to which the lower overall current I0−IΔ is applied is connected to that drain line of the discharging subtractor stage which is to discharge the other of the two output nodes with the higher overall current I0+IΔ. By using such connection logic, the original two control signals BA, A are manipulated in terms of the time periods of their respective rising and falling edges in such a way that associated corrected control signals BC, C are generated with the desired duty cycle at the two capacitive output nodes KBC, KC.

In particular, viewed globally, in particular the following chronological sequence and duration of the charging and/or discharging processes of the two capacitive output nodes KBC, KC are generated for the corrected control signals BC, C using the original control signals BA, A:

If the first control signal BA rises—as shown in diagram FA in FIG. 1—from its low level L to the high level H with the linear edge SFB, while the second control signal A falls with its linear edge FFA from its high level H to the low level L, the transistor N64 of the second subtractor stage DIF2 is connected through more strongly, while the transistor N62 is largely blocked. As a result, the base current I0, which is reduced by the current correction factor IΔ, is forced onto the drain line A21 by the power source SQ2. This electric current I2=I0−IΔ=I2* in the drain line A42 of the transistor N56 is made to flow-using the current mirror circuit SS21, and the capacitive output node KBC is charged with this current I2*. This is because the transistor N56 of the fourth subtractor stage DIF4 is essentially blocked until the high level H is reached by the first control signal BA or the second control signal A has reached its low level L. In this way, the capacitive output node KBC is charged with a delay with respect to the original conditions without a current correction factor. The current correction factor IΔ is expediently selected in such a way that the rise time of the rising edge SFB of the corrected control signal BC is prolonged in a desired way, the prolongation being ΔT1, for example. Since, at the start of the rise time of the first control signal BA at the time t0, the level of the second control signal A simultaneously drops, in the third subtractor element DIF3 the transistor N53 becomes more conductive than the transistor N54. As a result, the capacitive output node KC is discharged by the drain line A32 of the transistor N53 with the current I3=I0−IΔ of the power source SQ3. This means that the capacitive output node KC is discharged with a base current I0 which is reduced by the current correction factor IΔ. As a result, the level of the potential at the node KC drops more slowly than in the case of the original control signal A, being delayed by the time period ΔT1. If the current correction factor IΔ for charging the node KBC is selected to be essentially equal to the current correction factor for the discharging process of the capacitive output node KC, essentially the same time period RT is obtained for the corrected rising edge SFB and falling edge FFA of the two control signals BC, C.

As soon as the control signal A has reached the low level L, the p-type channel transistor P24 of the current mirror SS21 charges the node KBC to the supply voltage. As soon as the control signal BA has reached the high level H, the p-type channel transistor P24 of the current mirror SS21 expediently limits the charging process for the node KBC. As a result, the p-type channel P24 of the current mirror SS21 acts like the switch S2. The transistor N53 of the subtractor element DIF3 correspondingly acts as a switch S3.

If the level of the second control signal A then rises from its low level L to the high level H, while the first control signal BA simultaneously drops in the same time period from the high level H to the low level L, the transistor N61 of the first subtractor stage DIF1 is then connected through to a greater degree so that the current I1*=I1=I0+IΔ can be impressed on the source line A32 of the transistor n53 of the third subtractor stage DIF3 via the current mirror SS11. As a result, the capacitive output node KC is charged with the base current I0 which is enlarged by the current correction factor IΔ. Owing to the addition of the additional correction current factor IΔ, the node KC is charged here more quickly than in the case in which all the power sources SQ1 to SQ4 only draw the same base current I0. The current correction factor for charging the capacitive output node KC is expediently chosen to be essentially equal to the current correction factor IΔ when it is discharged. However, as this current correction factor acts in addition to the base current I0 when the node KC is charged, the node KC is charged more quickly than it is discharged later with the base current which is reduced by the current correction factor. The p-type channel transistor P21 of the current mirror circuit SS11 functions here as a switch S1 for connecting the power source SQ1 to the capacitive output node KC. This p-type channel transistor P21 becomes conductive here at the time at which the rising edge SFA of the control signal A begins. In this exemplary embodiment, this is the time t3. In a corresponding way, the n-type channel transistor N56 of the fourth subtractor stage DIF4 becomes conductive starting from the time t3 at which the falling edge FFB of the first control signal BA drops from the high level to the low level, but the level of the second control signal A rises. As a result, the base current I0, which is increased by the current correction factor IΔ, is subtracted from the capacitive output node KBC using the power source SQ4 and the node KBC is thus discharged more quickly than it is charged. Overall, the edge FFB thus falls from the high level H to the low level L within a time period FT which is shortened by ΔT2. In this way, a point K2 of intersection which is chronologically displaced with respect to the chronological position t4 of the original point K2 of intersection by the time period ZV2 is produced between the corrected, steeper rising edge SFA and falling edge FFB**. In this way, the signal eye SIA1 can thus be shortened in a desired way from its chronological end and the following, originally shorter signal eye SIA2 lengthened. The transistor N56 of the fourth subtractor stage DIF4 acts here as switch S4. The switch S4 is closed as soon as the level of the control signal A rises from the low level L to the high level H and the level of the control signal BA begins to drop. On the other hand, the transistor N56 opens the switch again, i.e. has a blocking effect, as soon as there is essentially no difference any more between the levels of the control signal A and BA. If A=BA, the two transistors N56, N58 are preferably semiconductive (=transitional state), the current of the power source SQ4 being divided, half and half, into the left-hand and the right-hand current paths of the subtractor stage DIF4. The same applies analogously to the other subtractor stages. If the input signals BA, A change their level states, all the switches S1 to S4 are advantageously switched over here.

Expressed in general terms, four transistor subtractor stages DIF1 with DIF4 which are connected to one another are used to control the chronological sequence and duration of the charging and/or discharging processes of the two capacitive output nodes KBC, KC by the power sources SQ1 with SQ4, preferably as follows:

A base current I0 which is increased by the current correction factor IΔ is applied to the source line SL1 of a first transistor subtractor stage DIF1 with which the first of the two capacitive output nodes KC is charged in each case via a current mirror circuit SS11, and a base current I0, which is reduced by the current correction factor IΔ, is applied to the source line SL2 of a second transistor subtractor stage DIF2 with which the second of the capacitive output nodes KBC is charged in each case via a current mirror circuit SS21. Correspondingly, a base current I0 which is reduced by the current correction factor IΔ is applied to the source line SL3 of a first transistor subtractor stage DIF3 with which in each case the first capacitive output node KC whose charging is greater by the current correction factor IΔ is discharged, and a base current I0 which is increased by the current correction factor IΔ is applied to the source line SL4 of a second transistor subtractor stage DIF4 with which in each case the second capacitive output node KBC whose charging is weaker by the current correction factor IΔ is discharged.

The logic circuit KE1 in FIG. 3 is distinguished in particular by the fact that the overall current consumption is overall essentially constant, specifically approximately 4×I0. Furthermore, the respective capacitive output node KBC, KC is dynamically charged and discharged again. The respective charging current and associated discharge current differ here by approximately 2×IΔ.

Figure 5:
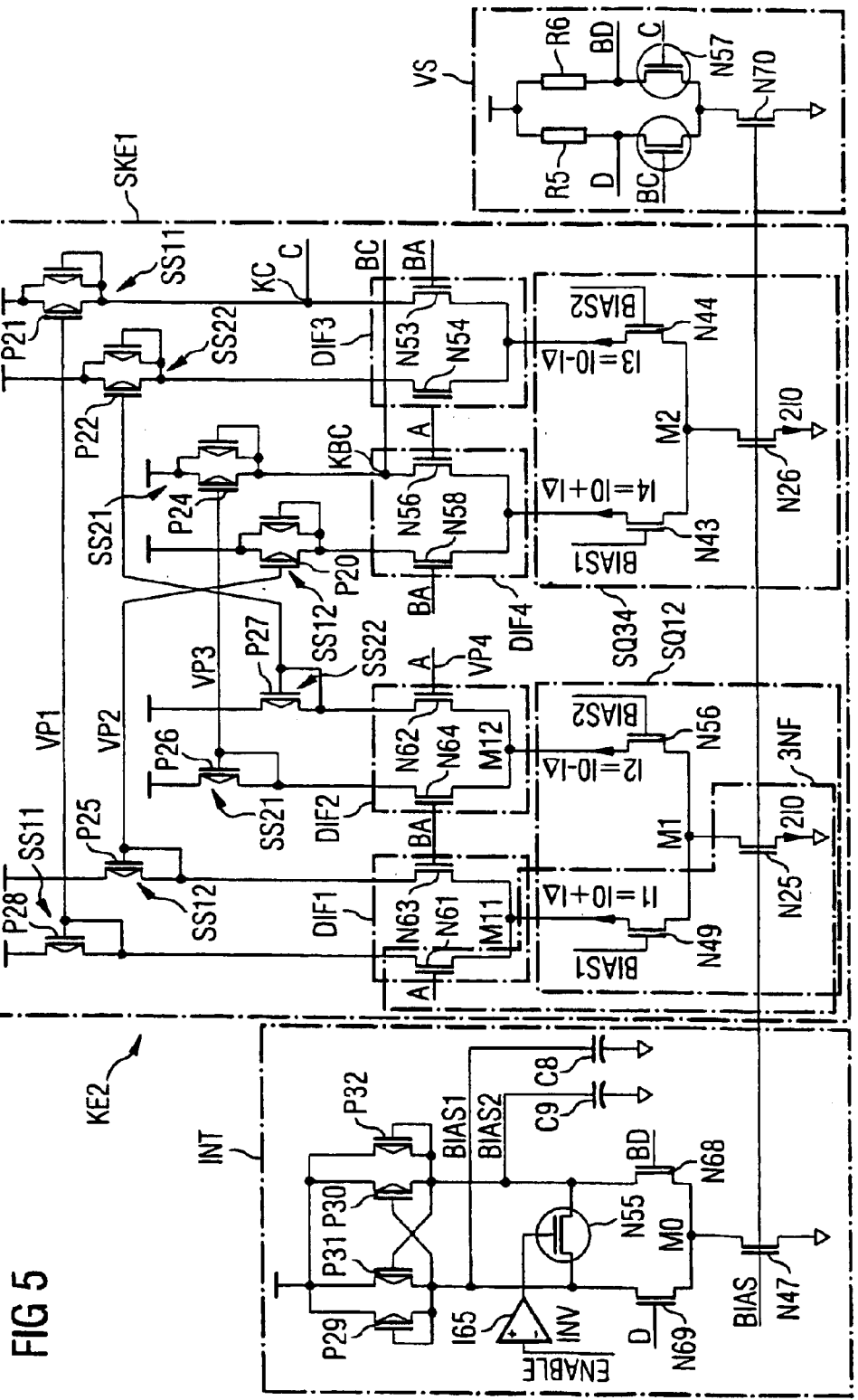

FIG. 5 shows, together with the integrator INT and the amplifier VS of the control loop according to FIG. 4, a correction unit KE2 that is modified in comparison with the correction unit KE1 in FIG. 3. The logic part SKE1 of the four subtractor stages DIF1 with DIF4 and the associated connection via the current mirrors SS11, SS12, SS21, SS22 of the correction unit KE1 in FIG. 3 is also used here in the correction unit KE2 in FIG. 5, which is illustrated by a dot-dashed outline with the reference SKE1. Instead of the charging power sources SQ1, SQ2, the two common subtractor stages DIF1, DIF2 are now connected to the drain lines of a further transistor subtractor stage SQ12. The latter has two largely identical n-type transistors N49, N56, into whose common source line M1 a further n-type transistor N25 is connected. The-n-type transistor N25 preferably draws twice the base current 2×I0. In a corresponding way, the two power sources SQ3, SQ4 in FIG. 3 are replaced by the subtractor element SQ34 in FIG. 5, which is embodied in the same way as the subtractor element SQ12. An n-type transistor N26, which also preferably draws twice the base current 2×I0, is inserted into the common source line M2 of two n-type transistors N43, N44. The subtractor elements SQ12, SQ34 apply the currents I1 to I4 to the source lines SL1 to SL4 of the four subtractor stages DIF1 to DIF4 in the logic part SKE1, in the same way as the four constant current sources SQ1 to SQ4. As the correction signal BIAS1 of the integrator INT is fed to the gate input of the transistor N49, and the correction signal BIAS2 of the integrator INT is fed to the gate input of the transistor N56 of the subtractor stage SQ12, the electric current of 2×I0 which is drawn from the transistor N25 is divided between the two transistors N49, N56 in such a way that the source-drain current across the transistor N49 is increased by a current correction factor IΔ with respect to the base current, while the drain-source current which flows through the transistor N56 flows as a base current I0 which is reduced by the same current correction factor IΔ, specifically on condition that the level of the correction signal BIAS1 is higher than the level of the correction signal BIAS2 (BIAS1>BIAS2). If BIAS1= BIAS2, IΔ is to be ignored, i.e. the current I1 or I2 through the two current paths of the subtractor stage SQ12 is essentially the same.

Figure 6A:
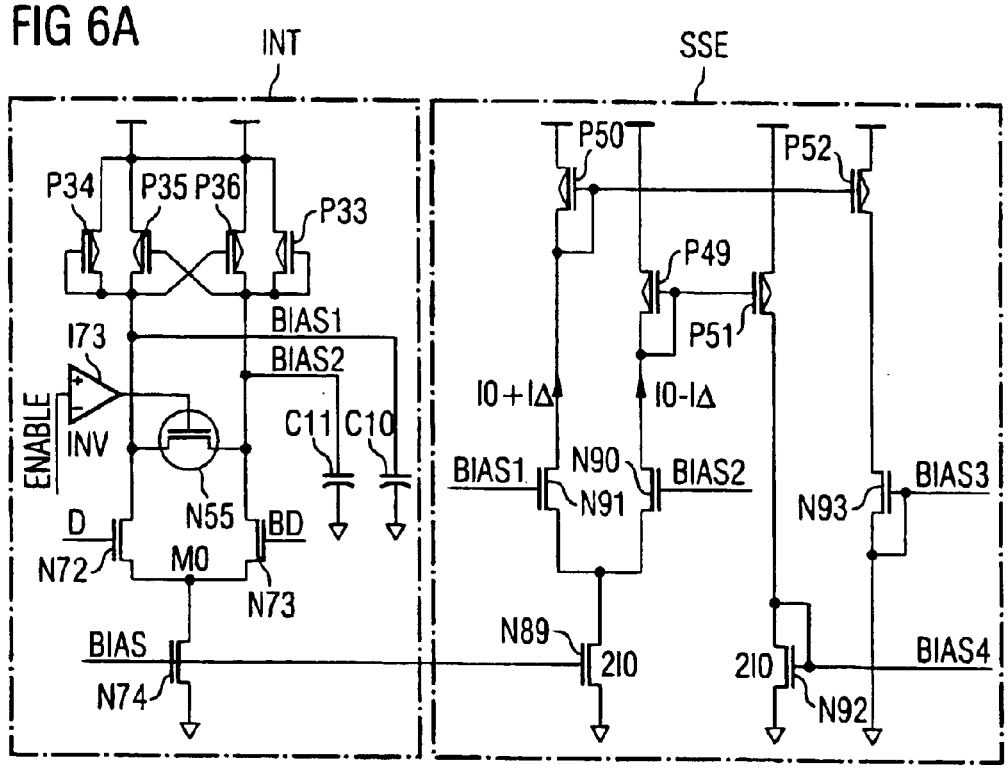
Figure 6B:
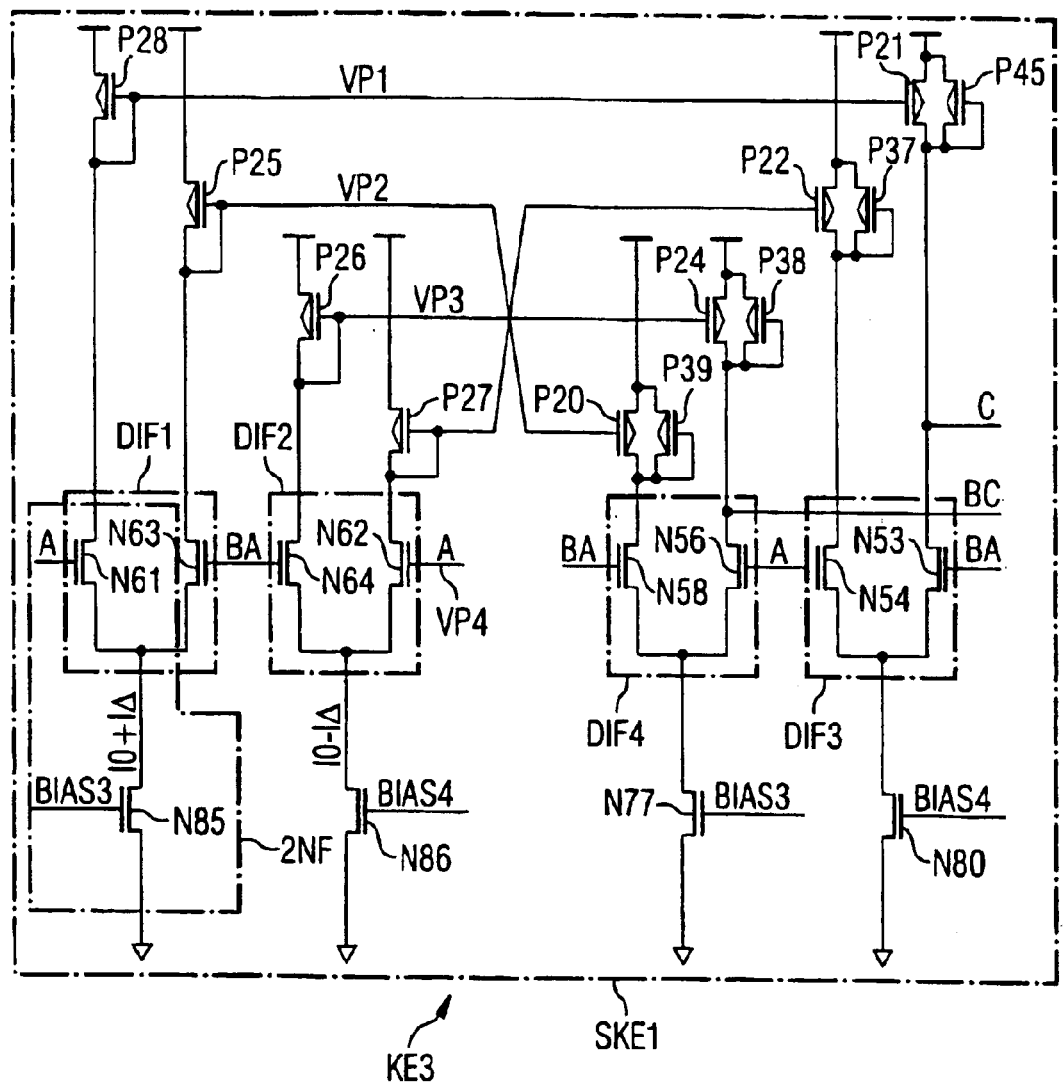

FIG. 6 shows a further correction unit KE3 (see especially FIG. 6B) that is modified with respect to the correction unit KE1, KE2 in FIGS. 3 and 5. The power sources SQ1 to SQ4 are now replaced by n-type channel transistors N85, N86, N77, and N80. These are driven by control signals BIAS3, BIAS4 of a current mirror SSE (see especially FIG. 6A) which generates the two control signals BIAS3, BIAS4 from the correction signals BIAS1, BIAS2 of the integrator INT (See especially FIG. 6A) of the control loop in FIG. 4. The control signals BIAS3, BIAS4 differ from one another in each case by a current correction factor +/−IΔ. If BIAS1 is greater than BIAS2, BIAS3 also becomes greater than BIAS4. The control signal BIAS3 corresponds to an electric base current I0 that is increased by the current correction factor IΔ while the correction signal BIAS4 is an electric base current I0 reduced by the same current correction factor IΔ. The correction signal BIAS3 is applied to the subtractor stages DIF1, DIF 4, and the correction signal BIAS4 is applied to the subtractor stages DIF2,DIF3, as a result of which the currents I1 to I4 are applied in the same way to the subtractor stages DIF1 to DIF4 on their respective common source line as in FIG. 3. As a result of the additional current mirror SSE in FIG. 6, the n-type channel FET transistors, of which three are connected in series, such as, for example, N25, N49, N61 of the correction unit KE2 are replaced by only two n-type transistors connected in series, such as, for example, N85, N61. The n-type transistors of which three are connected in series are shown outlined by dot-dashed lines in the correction unit KE2 in FIG. 5, and are provided with the reference 3NF. The connection of two n-type transistors in series in the correction unit KE3 in FIG. 6 is indicated there by a dot-dashed outline 2NF. In an analogous fashion, in the case of the correction unit KE3 in FIG. 6 with current mirror circuit SSE connected upstream, all the other three n-type transistors which are connected in series in the correction unit KE2 in FIG. 5 are replaced by configurations 2NF where two n-type transistors are connected in series. This permits a lower voltage value or potential value of the nodes VP1 to VP4 in the correction circuit KE3 according to FIG. 6 in comparison with the correction circuit KE2 in FIG. 5, specifically without the n-type transistors leaving their saturation region (=power source region). This in turn permits, under certain circumstances, a larger control range of IΔ and thus a correspondingly more widely adjustable correction range of the desired duty cycle. The p-type channel transistors P39, P38, P37, P45 which are connected to the p-type channel transistors P20, P24, P22, P21 of the current mirrors SS12, SS21, SS22, SS11 of the logic part SKE1 as diodes are used to limit the amplitude of the corrected control signals BC, C.

FIG. 7 shows the chronological signal profiles on the driving lines, output lines and two intermediately connected internal lines of the correction unit KE2 according to FIG. 5. In the upper half of the diagram, the two signal profiles of the original control signals BA, A are shown in accordance with the diagram FA in FIG. 1. The higher signal level H preferably corresponds here to the value of the supply voltage VDD, which is higher in absolute terms, while the lower signal level L≠VSS<VDD. VSS is preferably the lower supply voltage here, often referred to as GND (ground). The potential of VSS can also differ from ground=0 V, for example become negative. In particular, the respective potential level VDD, VSS is set in such a way that the n-type and p-type transistors can be operated in the saturation region (=power source region). The level profile VP1* is then established on the internal line VP1 of the current mirror SS11 as a function of the signal level A. On the other hand, the level profile VP2*, which is inverse or complementary with respect to the level profile BA, is assigned to the internal line VP2 of the current mirror SS12. A potential excursion of SW1 is obtained between the two level profiles VP1* and VP2*. The maximum upper potential level is preferably given here by the upper value of the supply voltage VDD. The potential levels on the internal lines VP3, VP4 of the current mirrors SS21, SS22 are also represented in FIG. 7 in relation to the original control signals A, BA. The level profile VP3* on the internal line VP3 follows the profile of the control signal A here, while the level profile VP4* on the line VP4 is assigned to the control signal BA. Between the upper and lower level states, a signal excursion of SW2 is obtained here, the signal excursion SW2 being less than the signal excursion SW1 between the level profiles VP1* and VP2*. This relation is established when the correction signal BIAS3 is higher than BIAS4 (I(N85)>I(NB86)→I0+IΔ>I0−IΔ). The upper potential level is in turn determined by the supply voltage VDD.

Finally, in the lower half of the diagram, the potential level profiles of the corrected control signals BC, C at the capacitive output nodes KBC, KC are also shown. The arrow PF1 indicates that the falling edge of the intermediate signal VP1* triggers the charging of the node KC in order to obtain a quickly, rising edge for the desired corrected control signal C. The reason for this is that, in contrast to an n-type transistor, the p-type transistor P21 of the current mirror SS11 opens, i.e. allows a greater drain-source current to flow, when the gate voltage drops. This corresponds to the closing of the switch S1 in FIG. 2.

Finally, FIG. 8 shows a schematic view of a second equivalent circuit or correction unit ES2 with which a second variant of the inventive principle for correcting the given duty cycle of the two control/reference signals according to FIG. 1 can be carried out. In contrast to the function of the first equivalent circuit ES1 in FIG. 2, in the equivalent circuit ES2 the two capacitive output nodes KBC, KC are now charged statically using the power sources SQ2, SQ1. This means that the switches S2, Si which are switched on and off there in FIG. 2 by the rising edges SFB, SFA of the two control signals BA, A in each case have been omitted. Dynamic switching on and off of the power sources SQ2, SQ1 is therefore dispensed with. Instead, the capacitive output node KBC is essentially constantly charged with the electric current I2=I0−IΔ of the power source SQ2, and the node KC is essentially constantly charged with the electric current I1=I0+IΔ of the power source SQ1. only the discharging of the two capacitive output nodes KBC, KC is carried out dynamically using switches S3, S4. Here, the switch S3 is switched on and off using the control signal A while the switch S4 is driven and deactivated using the control signal BA. This dynamic switching of the switch S3 using the control signal A is illustrated by an action arrow WA in FIG. 8. Correspondingly, the switching on and off of the switch S4 by using the control signal BA is indicated by an action arrow WBA. The two switches S3, S4 are connected by connecting lines L3, L4 to a common electric line GL into which a power source SQD is connected. This power source SQD draws twice the base current 2×I0 here. In order to correct the actual duty cycle of the given control signals BA, A as desired in accordance with the diagram FA in FIG. 1 to form a desired setpoint duty cycle such as, for example, TH/TL=1 in accordance with the diagram FC in FIG. 1, the switching on and off of the switches S3, S4 is carried out in particular as follows:

If the edge FFA of the second control signal A of the edge FFA of the control signal A falls at the time t0, the switch A is opened. As a result, the node KBC is charged with the base current I0 reduced by the current correction factor IΔ. As a result, a rising edge SFB occurs for the corrected control signal BC starting from the time t0. The rising edge SFB rises over a time period RT up to the time t2. The time period RT is prolonged by the time correction factor ΔT1 in comparison with the original rise time RT. Therefore, the rising edge SFB has a flatter profile than the original edge SFB. At the same time, the switch S4 is closed when the edge SFB of the first control signal BA begins to rise at the time t0. A current IC is therefore subtracted from the tap line LC, the current IC being calculated in accordance with Kirchhoff's rule:

$$IC=2I0-I1, I1=I0-IΔ→IC=I0-IΔ.$$

The node KC is thus discharged with a base current I0 that is reduced by the current correction factor IΔ, i.e. the edge FFA** of the corrected control signal C falls more slowly than in the case of the original control signal A (on condition that the base current I0 would have brought about the original edge FFA).

If the edge SFA of the second control signal A rises at the time t3, the switch A is closed. Then, a discharging process occurs on the tap line LB of the capacitive output node KBC. According to Kirchhoff's rule, a charge current IBC, calculated as follows:

$$IBC=2I0-I2, I2=I0-IΔ→IBC-I0+IΔ$$

flows there.

Figure 9:
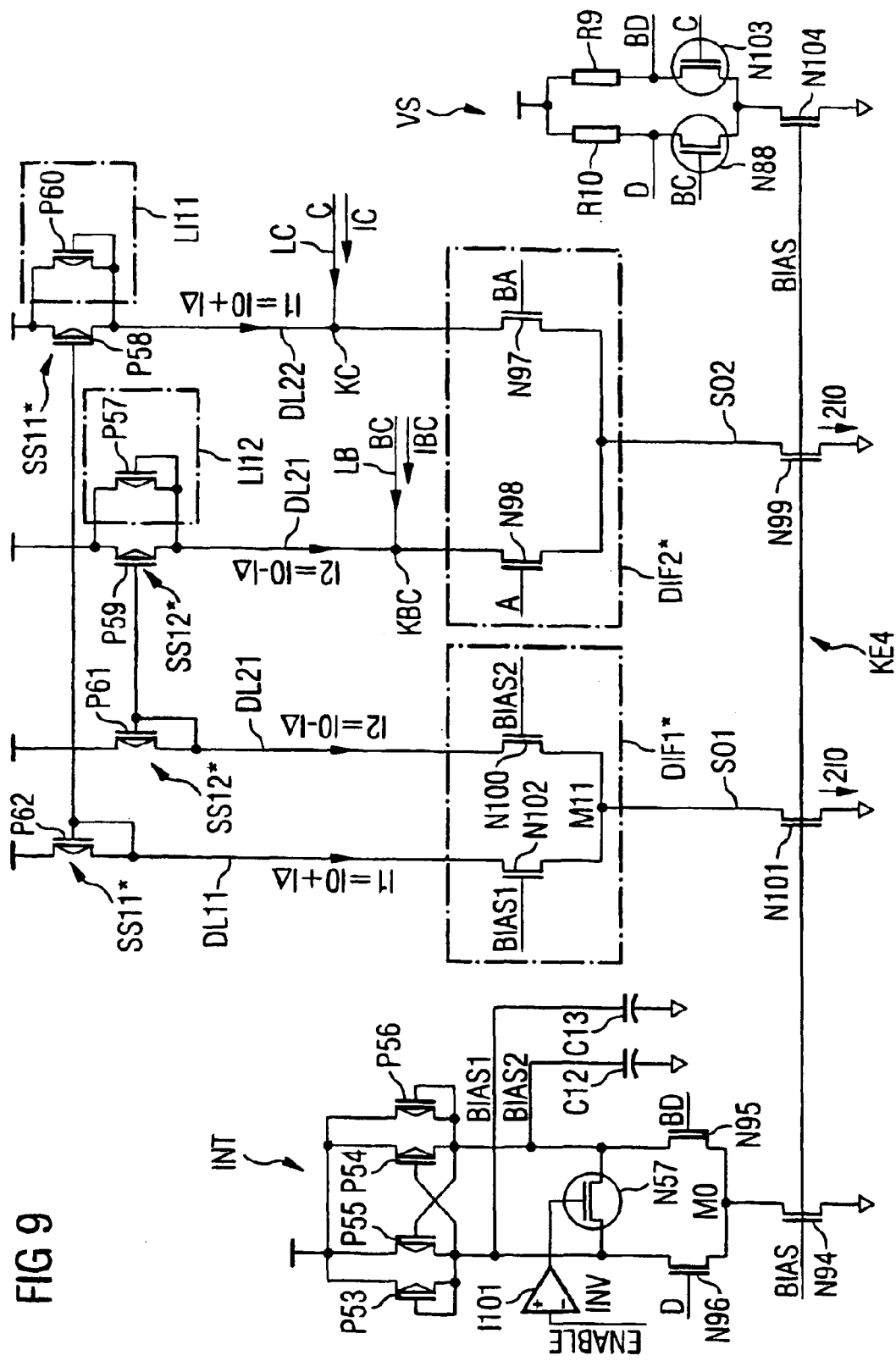
FIG. 9 is a circuit diagram showing a logic circuit with which the correction method of the correction unit according to FIG. 8 can be carried out.

This means that the node KBC is discharged with a base current I0 which is increased by the current correction IΔ. As a result, the falling edge FFB of the corrected control signal BC is made steeper than its original edge FFB. As explained previously with respect to FIGS. 1 and 2, the originally longer signal eye SIA1 can thus be shortened in a desired way and a specific duty cycle or specific time periods TH, TL can be set for every two successive signal eyes. If the falling edge FFB of the first signal level BA occurs at the time t3, the switch S4 is opened, as a result of which the capacitive output node KC is charged with the electric current I1 of the power source SQ1=I0+IΔ. In other words, the potential level for the corrected control signal C rises at the output node KC with a steeper rising edge SFA than the original edge SFA. In this way, the desired, correction control signals can thus also be generated in accordance with FIGS. 1, 2 while the expenditure on circuitry is reduced. FIG. 9 shows a schematic view of a logic circuit KE4 with which the correction method of the second equivalent circuit according to FIG. 8 can be carried out. The logic circuit or correction unit KE4 has two subtractor stages DIF1*, DIF2*. These are each formed by pairs of n-type transistors N102, N100 and N98, N97. Here, the source lines of the n-type transistor pairs N100, N102 and N97, N98 are each connected to one another. A further n-type transistor N101, which draws the static current 2×I0, i.e. twice the base current, is inserted into the common source line SO1 of the first subtractor stage DIF1*. Correspondingly, the n-type transistor N99 which also statically draws twice the base current 2×I0, is inserted into the common source line S02 of the second subtractor stage DIF2*. The gate line of first transistor N102 of the first subtractor stage DIF1* is driven using the correction signal BIAS1 at the output of the integrator INT. Correspondingly, the second correction signal BIAS2 of the integrator INT drives the gate line of the second transistor N100 of the first subtractor stage DIF1*. If, for example, the correction signal BIAS1 has a higher level than the correction signal BIAS2, the electric current I1=I0+IΔ is impressed on the drain line DL11 of the transistor N102, while the base current I0 which is reduced by the current correction factor IΔ is applied to the drain line DL21 of the second transistor N100, i.e. the smaller electric current I2=I0−IΔ therefore flows there. As the two correction signals BIAS1, BIAS2 are essentially static signals owing to the integrating effect of the integrator INT, the two branches DL11, DL21 of the subtractor stage DIF1* correspond essentially to the power sources SQ1 and SQ2 of the equivalent circuit diagram ES2 in FIG. 8. The electric current I1 is made to flow here in the drain line DL22 of the n-type channel transistor N97 of the second subtractor stage DIF2* by using a current mirror SS11* which is formed and fashioned in a known manner by two p-type channel transistors P62, P58 which are connected to one another. The tap line LC is connected to this drain line DL22 in order to tap the corrected output signal C. In this way, the capacitive output node AC in the drain line DL22 is statically charged with the current I1. Correspondingly, the electric current I2=I0−IΔ is impressed on the drain line DL21 of the n-type transistor N98 of the second subtractor stage DIF2* using the current mirror SS12* on the basis of the source line DL21 of the first subtractor stage DIF1*. As a result, the capacitive output node KBC in the drain line DL21 of the transistor N98 can be statically charged with the current I2. Here, the original control signal A is applied to the gate line of the n-type transistor N98. The gate line of the second transistor N97 of the second subtractor stage DIF2* is, on the other hand, driven by the original control signal BA. The tap line LB is connected into the capacitive output node KBC of the drain line DL21. If a rising edge of the control signal A now occurs, the transistor N98 conducts more strongly than the transistor N97. The latter is essentially blocked. As a result, the discharge current IBC flows within the tap line LB, in which case IBC=I0+IΔ. If a rising edge of the control signal BA occurs while the control signal A is falling, the transistor N97 conducts. Then, the tap current IC is subtracted in the tap line LC. For this, IC=I0−IΔ in accordance with Kirchhoff's rule. Expressed in general terms, two capacitive output nodes KBC, KC are therefore statically charged in the logic/memory module KE4 using a base current I0 which is reduced by a current correction factor IΔ and a base current I0 which is increased by a current correction factor IΔ. Only the discharging of these two capacitive output nodes KBC, KC is dynamically switched by the uncorrected control/reference signals BA, A in such a way that that capacitive output node KBC which has been statically charged with a base current I0 which is reduced by the current correction factor IΔ is discharged with a base current I0 which has been increased by approximately the same current correction factor IΔ, and at the same time that capacitive output node KC which has been previously charged with a base current I0 which has been increased by a current correction factor IΔ is discharged again with a base current I0 which has been reduced by approximately the same current correction factor IΔ.

The static charging process of the respective capacitive output node KBC, KC is respectively limited using a limiting circuit LI11, LI12 connected upstream. The limiting circuit LLI11, LI12 is formed in each case by using a p-type channel transistor P60, P57 which is connected in parallel with the output-end p-type channel transistor P58, P59 of the current mirrors SS11*, SS12*.

The logic circuit KE4 according to FIG. 9 is distinguished in particular by the fact that, in contrast to the logic circuits KE2, KE3, it only requires static charging currents when charging the capacitive output notes KBC, KC. Dynamic current mirroring, and thus complicated charging and discharging processes, are thus largely avoided. This also connects a higher duty cycle with which the logic circuit KE4 can be operated. For this reason, this logic circuit KE4 is preferably suitable for high-speed memory chips such as SDRAMs, SGRAMs, for example. This permits clock frequencies of 500 MHz and more, i.e. over 500 MHz.

In summary, the correction method according to the invention permits, in particular, data eyes of essentially the same magnitude to be generated between the two control signals which are customarily used, in high-performance synchronous data transmissions with two data bits per clock cycle, for example in systems with double data rate memory modules. This corresponds to a 50:50 duty cycle between the two level states of the respective control signal. Deviations in the duty cycle would in fact always generate a relatively long data bit which would be followed by a relatively short data bit as the data signals are synchronized with such a clock. A relatively short data bit would, however, limit the upper limiting frequency of the system with respect to the logic/memory module, which would, however, mean a lower yield of the theoretically higher speed class. For this reason, it is particularly desirable to use the correction method according to the invention to set a duty cycle of a clock signal to the ideal value of 50%.

The correction principle according to the invention will be explained once more by way of example in a brief overview of the embodiment variants in FIGS. 1 to 9.

FIG. 1 shows, in diagram FA, the differential periodic clock signals BA, A. The high phase TH and the low phase TL of the signal BA are of different lengths there. The switching time of subtractor stages is preferably defined here by the point of intersection of the input signals BA, A. In accordance with the known correction method from U.S. Pat. No. 6,169,434, the length of the data eyes could be corrected in accordance with the diagram FB by adding different DC voltages to the original control signals A, BA so that the curves would be displaced in the ordinate direction. In FIG. 1, a DC voltage was added to the signal A until the signal A had the profile of signal B in diagram FB. By changing the absolute signal levels H*, L* it is thus possible to set a desired duty cycle of the control signals B, BB, in particular a 50:50 duty cycle.

The diagram FC in FIG. 1 shows the profile of the corrected control signals BC, C after the method according to the invention has been carried out. The respectively falling edge FFA of the control signal A and the respectively assigned rising edge SFB of the control signal BA are slowed down at the beginning of the longer data eye SIA1 and the respectively falling edge FFB and the respectively associated rising edge SFA are speeded up at the end of this data eye SIA1. As a result of this the duty cycle is changed to 50 percent, as is shown in the diagram FC of FIG. 1.

FIG. 3 shows a schematic configuration for switching the capacitive output nodes C, BC. Each node is charged or discharged by a power source SQ1 to SQ4 in each case. To produce the different rise and fall times, in each case two power sources such as SQ1, SQ4, for example, are increased by a current correction factor IΔ, and in each case two power sources such as SQ2, SQ3, for example, are respectively decreased by the same current correction value IΔ. In this context, this logic circuit implicitly requires a higher overall current at the time of the steep edges (switches S1 and S4 closed) than at the time of the flatter edges (switches S2 and S3 closed). The setting of the duty cycle according to the inventive principle is essentially independent here of the given edge steepness of the original control signals A, BA, as, of course, the inventive principle particularly sets the edge steepness of the generated corrected control signals BC, C in a controlled fashion. The adjustment range of the duty cycle is in particular dependent on the current correction factor IΔ here. This can be varied in a relatively large range if a large base current I0 is selected. In contrast, the known method from U.S. Pat. No. 6,169,434 requires relatively slow edges of the original control signals A, BA in order to still make possible the point of intersection of the edges by adding or subtracting a constant potential level. The original edge steepness therefore directly influences the correctable range of the duty cycle in this known method.

In the correction method according to the invention, it is, in contrast, not necessary to apply a voltage offset to the originally present control signals but rather it is already sufficient to change the rise time and the fall time (slew rate) of the clock signals. A differential circuit which supplies different currents to the nodes KBC, KC but largely has constant power consumption overall is respectively implemented here, by way of example, by using the logic circuits KE2, KE3 and, by way of approximation, also KE4 in accordance with FIGS. 3, 5, 6 and 9.

FIG. 3 shows the implementation of the correction function in accordance with the equivalent circuit diagram in FIG. 2. Here, the p-type channel transistor P21 corresponds to the switch S1 and to the power source SQ1, the p-type channel transistor P24 corresponds to the power source SQ2 and to the switch S2, the n-type channel transistor N53 corresponds to the switch S3, and the n-type channel transistor N56 corresponds to the switch S4. In particular the control loop according to FIG. 4 is expedient for generating corrected control signals BC, C with a desired duty cycle. The output clock signals BC, C of the correction unit KE1 are standardized by using an amplifier VS in terms of amplitude and edge steepness, and drive an integrator INT by feeding back the amplified output signals BD, D. This integrator INT generates two control voltages BIAS1, BIAS2 which change the edge steepness of the correction unit KE1 until a 50:50 duty cycle is established at the outputs of the amplifier VS.

FIGS. 5, 6 show two further circuit variants for the correction unit. In the correction unit KE3 in FIG. 6, an additional current mirror SSE is introduced, the current mirror SSE replacing the respective three n-type channel transistors connected in series in the correction unit KE2 in FIG. 5 by two n-type transistors connected in series. This permits a lower voltage value of the internal lines VP1 to VP4 at the output-end source lines of the transistors of the two current-charging subtractor stages DIF1, DIF2 of the correction unit KE2. Here, the n-type transistors can retain their saturation region (=power source region). This in turn permits, under certain circumstances, a relatively large adjustment range of the current correction facto IΔ, and thus permits the correction range of the duty cycle. The transistors P45, P37, P38, P39 in the current mirror circuits of the correction unit KE3 are expediently connected as diodes and are used to limit the amplitudes of the correction signals BC, C.

FIG. 7 shows the signal profiles that are established for the various nodes VP1 to VP4 of the correction unit KE2 in FIG. 5. The correction signals BIAS1 and BIAS2 are established in such a way that the signals VP1*, VP2* at the nodes VP1, VP2 drop, in the active state of the supply voltage VDD, to a lower level (excursion SW1 is greater than SW2; cf. FIG. 7) and generate a larger drain-force current at the p-type channel transistor P20, P21. A large current across P21 quickly charges the node KC to VDD potential, and a small current across the n-type channel transistor N44 discharges the node KC slowly if the control signal BA is high.

FIG. 8 shows a second improved principle for implementing the edge-steepness-controlled duty cycle correction principle according to the invention. The base point of the equivalent circuit ES2 is formed by a power source which has twice the starting current 2×I0. In each case two power source SQ1, SQ2, which are increased or decreased by a correction amount IΔ, function as the parasitic load in the subtractor stage of this equivalent circuit ES2. If the control signal BA becomes free, the capacitive output node KC is discharged with the electric current 2×I0−(I0+IΔ)=I0−IΔ and charged with the electric current I0+IΔ. The capacitive output node KBC is, on the other hand, discharged with the electric current 2×I0−(I0−Δ)=I0+IΔ and charged with the electric current I0−IΔ.

FIG. 9 shows an exemplary logic circuit KE4 for this charging/discharging principle. An advantage in comparison with the logic circuit KE3 in FIG. 6 is the smaller complexity of the circuitry and the lower power requirement. A further, significant difference is in particular the fact that in the logic circuit KE3 in FIG. 6 electric currents are mirrored dynamically by using the signals VP1 to VP4, i.e. they are each set to high for half a clock cycle, and to low for half a clock cycle. However, in practice this is problematic at very high clock frequencies of, for example approximately 500 MHz or above as a large number of charging processes and discharging processes are necessary. On the other hand, if the logic circuit KE4 is implement according to FIG. 9, static currents are advantageously used to charge the capacitive output nodes KBC, KC. To discharge the nodes KBC, C, only the two transistors N98, N97 of the second differential stage DIF2* are connected to the original control signals BA, A to be corrected.

It may, if appropriate, also be expedient to discharge the two nodes KC, KBC statically in an opposite fashion to that described above and charge them dynamically by using a control process using the signals present originally (or signals which correspond to them).

The various embodiment variants of the correction method according to the invention which are presented in FIGS. 1 to 9 are preferably suitable for being implemented using CMOS technology, in particular for CMOS logic/memory chips such as DRAMs, SDRAMS, SGRAMs. The correction method according to the invention can preferably be used for double data rate memories, in particular 128 M DDR SGRAM 500 MHz.

I claim:

1. A method for correcting a given duty cycle between a first time period of a first level state and a second time period of a second level state of at least a periodic control/reference signal of a logic/memory unit to form a desired corrected duty cycle, which comprises:

setting the desired corrected duty cycle between the time periods of the first and second level states of the periodic control/reference signal by changing at least one of a rising time period of a rising edge and a fall time period of a falling edge by a predefinable correction time period, correcting a duty cycle of a further periodic control/reference signal having essentially identical level states as the first periodic control/reference signal by offsetting by half of a period the level states of the further periodic control/reference signal with respect to the level states of the periodic control/reference signal; and defining switching times for controlling data signals at points of intersection of rising and falling edges of the two periodic control/reference signals.

2. The method according to claim 1, wherein the changing step involves increasing the at least one of the rising time period of the rising edge and the fall time period of the falling edge.

3. The method according to claim 1, wherein the changing step involves decreasing the at least one of the rising time period of the rising edge and the fall time period of the falling edge.

4. The method according to claim 1, which further comprises providing a corrected control/reference signal with the desired corrected duty cycle as a clock signal for clocking data signals.

5. The method according to claim 4, which further comprises correcting a duty cycle by corresponding the time period of the first level state essentially to the time period of the second level state of the corrected control/reference signal.

6. The method according to claim 1, which further comprises transmitting the data signals at the switching times.

7. The method according to claim 1, which further comprises storing the data signals at the switching times.

8. The method according to claim 1, which further comprises processing the data signals at the switching times.

9. A double data rate memory module, comprising a logic unit for carrying out the method according to claim 1.

10. A method for correcting a given duty cycle between a first time period of a first level state and a second time period of a second level state of at least a periodic control/reference signal of a logic/memory unit to form a desired corrected duty cycle, which comprises:

setting the desired corrected duty cycle between the time periods of the first and second level states of the periodic control/reference signal by changing at least one of a rising time period of a rising edge and a fall time period of a falling edge by a predefinable correction time period;

correcting a duty cycle of a further periodic control/reference signal having essentially identical level states as the first periodic control/reference signal by offsetting by half of a period the level states of the further periodic control/reference signal with respect to the level states of the periodic control/reference signal and dynamically switching four power sources with the uncorrected periodic control/reference signals by:

loading a first capacitive output node of the logic/memory unit during the rising edge of the periodic control/reference signal with a base current, the base current being changed by a current correction factor;

recharging the first capacitative output node during the falling edge of the first periodic control/reference signal with the base current, the base current being changed by the current correction factor;

loading a second capacitive output node during a rising edge of the further periodic control/reference signal with the base current, the base current being changed by the current correction factor; and recharging the second capacitative output node during a falling edge of the further periodic control/reference signal with the base current, the base current being changed by the current correction factor; and tapping the corrected control/reference signals at the first and second capacitive output node with the desired duty cycle.

11. The method according to claim 10, which further comprises deriving the current correction factor by subtracting the level states of the two uncorrected periodic control/reference signals, the levels being integrated over at least one period.

12. The method according to claim 10, which further comprises controlling a time sequence and duration of at least one of the loading and recharging of the two capacitive output nodes with the power sources, the power sources using four mutually-connected transistor difference stages.

13. The method according to claim 12, which further comprises:

applying the base current increased by the current correction factor to a source line of a first of the transistor difference stages via a first current mirror circuit;

charging a first of the two capacitive output nodes with the first of the transistor difference stages via the first current mirror circuit; and applying the base current reduced by the current correction factor to a source line of a second of the transistor difference stages via a second current mirror circuit; and charging the second of the two capacitive output nodes with the second of the transistor difference stages via the second current mirror circuit.

14. The method according to claim 12, which further comprises:

applying the base current reduced by the current correction factor to a source line of a first of the transistor difference stages and discharging in each case the first capacitive output node that is charged more strongly by the current correction factor with the first of the transistor difference stages; and applying the base current that is increased by the current correction factor to a source line of a second of the transistor difference stages and charging in each case the second capacitive output node that is charged more weakly by the current correction factor with the second of the transistor difference stages.

15. The method according to claim 13, wherein the applying of current to the common source line of the respective transistor difference stage is performed in each case using a constant current source, the base current of the constant current source being changed by the current correction factor.

16. The method according to claim 14, wherein the applying of current to the common source line of the respective transistor difference stage is performed in each case using a constant current source, the base current of the constant current source being changed by the current correction factor.

17. The method according to claim 13, which further comprises supplying the common source line of each of the transistor difference stages with power by, in each case, using a respective current mirror circuit.

18. The method according to claim 14, which further comprises supplying the common source line of each of the transistor difference stages with power by, in each case, using a respective current mirror circuit.

19. The method according to claim 14, which further comprises supplying the source lines of the first group of the two charging difference stages and the source lines of the second group of the two discharging difference stages with power using a further transistor difference stage, the further transistor difference stage being assigned to a group.

20. The method according to claim 15, which further comprises supplying the source lines of the first group of the two charging difference stages and the source lines of the second group of the two discharging difference stages with power using a further transistor difference stage, the further transistor difference stage being assigned to a group.

21. A logic/memory module, comprising a logic unit for carrying out the method according to claim 10.

22. A double data rate memory module, comprising a logic unit for carrying out the method according to claim 10.

23. The method according to claim 10, wherein the changing step involves increasing the at least one of the rising time period of the rising edge and the fall time period of the falling edge.

24. The method according to claim 10, wherein the changing step involves decreasing the at least one of the rising time period of the rising edge and the fall time period of the falling edge.

25. The method according to claim 10, which further comprises providing a corrected control/reference signal with the desired corrected duty cycle as a clock signal for clocking data signals.

26. The method according to claim 25, which further comprises correcting a duty cycle by corresponding the time period of the first level state essentially to the time period of the second level state of the corrected control/reference signal.

27. A method for correcting a given duty cycle between a first time period of a first level state and a second time period of a second level state of at least a periodic control/reference signal of a logic/memory unit to form a desired corrected duty cycle, which comprises:

setting the desired corrected duty cycle between the time periods of the first and second level states of the periodic control/reference signal by changing at least one of a rising time period of a rising edge and a fall time period of a falling edge by a predefinable correction time period;

correcting a duty cycle of a further periodic control/reference signal having essentially identical level states as the first periodic control/reference signal by offsetting by half of a period the level states of the further periodic control/reference signal with respect to the level states of the periodic control/reference signal;

essentially statically charging two capacitive output nodes of the logic/memory module with a base current, the base current being changed by a current correction factor;

dynamically switching a discharging of the two capacitive output nodes by the uncorrected periodic control/reference signals in order to discharge the capacitive output node that was previously statically charged with a base current reduced by the current correction factor by applying the base current increased by the current correction factor; and discharging again the capacitive output node previously statically charged with the base current increased by the current correction factor with the base current reduced by the current correction factor.

28. The method according to claim 27, which further comprises deriving the current correction factor by subtracting the levels of the two uncorrected control/reference signals, the levels being integrated over at least one period.

29. The method according to claim 27, which further comprises limiting a static charging process of the respective capacitive output node using a limiting circuit.

30. A logic/memory module, comprising a logic unit for carrying out the method according to claim 1.

31. A logic/memory module, comprising a logic unit for carrying out the method according to claim 27.

32. A double data rate memory module, comprising a logic unit for carrying out the method according to claim 27.

33. The method according to claim 27, wherein the changing step involves increasing the at least one of the rising time period of the rising edge and the fall time period of the falling edge.

34. The method according to claim 27, wherein the changing step involves decreasing the at least one of the rising time period of the rising edge and the fall time period of the falling edge.

35. The method according to claim 27, which further comprises providing a corrected control/reference signal with the desired corrected duty cycle as a clock signal for clocking data signals.

36. The method according to claim 35, which further comprises correcting a duty cycle by corresponding the time period of the first level state essentially to the time period of the second level state of the corrected control/reference signal.

\* \* \* \* \*